(12) United States Patent
Tembhurne et al.

(10) Patent No.: US 11,781,230 B2
(45) Date of Patent: *Oct. 10, 2023

(54) INTEGRATED PHOTO-ELECTROCHEMICAL DEVICE FOR CONCENTRATED IRRADIATION

(71) Applicant: ECOLE POLYTECHNIQUE FÉDÉRALE DE LAUSANNE (EPFL), Lausanne (CH)

(72) Inventors: Saurabh Tembhurne, Crissier (CH); Meng Lin, Renens (CH); Sophia Haussener, Lausanne (CH)

(73) Assignee: ECOLE POLYTECHNIQUE FÉDÉRALE DE LAUSANNE (EPFL), Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/581,305

(22) Filed: Jan. 21, 2022

(65) Prior Publication Data

US 2022/0220623 A1    Jul. 14, 2022

Related U.S. Application Data

(62) Division of application No. 16/325,743, filed as application No. PCT/IB2017/055019 on Aug. 18, 2017, now Pat. No. 11,248,301.

(Continued)

(30) Foreign Application Priority Data

Aug. 19, 2016  (EP) .................................. 16020308

(51) Int. Cl.
*C25B 1/00*    (2021.01)
*H02S 40/38*   (2014.01)
(Continued)

(52) U.S. Cl.
CPC ................. *C25B 1/55* (2021.01); *C25B 9/19* (2021.01); *C25B 15/02* (2013.01); *H02S 40/22* (2014.12); *H02S 40/38* (2014.12); *H02S 40/425* (2014.12)

(58) Field of Classification Search
CPC ....... H01L 31/00–078; Y02E 10/50–60; C25B 1/003; C25B 1/10; C25B 1/04;
(Continued)

(56) References Cited

U.S. PATENT DOCUMENTS

| 2004/0025931 A1* | 2/2004 | Aguglia | .................. F24S 10/17 |
| | | | 136/246 |
| 2009/0179139 A1* | 7/2009 | Hines | .................. H01L 31/0547 |
| | | | 250/203.4 |

(Continued)

FOREIGN PATENT DOCUMENTS

| JP | WO2015040988 | * 3/2015 |
| WO | WO2005116299 | * 12/2005 |

*Primary Examiner* — Bach T Dinh
(74) *Attorney, Agent, or Firm* — Nixon & Vanderhye P.C.

(57) ABSTRACT

The present invention relates to a photo-electrochemical device for production of a gas, liquid or solid using concentrated electromagnetic irradiation. The device comprises a photovoltaic component configured to generate charge carriers from the concentrated electromagnetic irradiation; and an electrochemical component configured to carry out electrolysis of a reactant. The photovoltaic component contacts the electrochemical component at a solid interface to form an integrated photo-electrochemical device; and further includes at least one reactant channel or a plurality of reactant channels extending between the photovoltaic component and the electrochemical component to transfer heat and the reactant from the photovoltaic component to the electrochemical component. The integrated photo-electrochemical device and auxiliary devices (such as concentrator, flow controllers) build a system which can flexibly react to (Continued)

changes in operating condition and guarantee best performance.

21 Claims, 14 Drawing Sheets

Related U.S. Application Data

(60) Provisional application No. 62/376,923, filed on Aug. 19, 2016.

(51) Int. Cl.
*C25B 1/55* (2021.01)
*H02S 40/42* (2014.01)
*H02S 40/22* (2014.01)
*C25B 15/02* (2021.01)
*C25B 9/19* (2021.01)

(58) Field of Classification Search
CPC .... C25B 1/55; C25B 9/08; C25B 9/50; C25B 3/21; C25B 11/049
USPC .................................................. 136/243–265
See application file for complete search history.

(56) References Cited

U.S. PATENT DOCUMENTS

2009/0223555 A1* 9/2009 Ammar ............... H01L 31/0543
136/246
2016/0186342 A1* 6/2016 Ono .......................... C25B 3/25
204/230.5

* cited by examiner

Table Temperature independent reference case parameters used in the simulations.

| Parameter name | Parameter value | Unit |
|---|---|---|
| No. of wavelengths for EM simulation | 150 | - |
| Integrated PEC system width-y direction | 1 | cm |
| Diameter of water channel on top of PV | 0.2 | mm |
| Thickness of top aSi layer | 130* | nm |
| Thickness of middle ucSi layer | 1.86* | μm |
| Thickness of bottom ucSi layer | 4.5* | μm |
| Thickness of top $Ga_{0.51}In_{0.49}P$ layer | 280* | nm |
| Thickness of bottom GaAs layer | 1.5* | μm |
| Diameter of Anodic and Cathodic channels of EC | 0.2 | mm |
| Thickness of GDL | 400 | μm |
| Thickness of Catalyst layer | 100 | nm |
| Active specific surface area | 10000 | 1/m |
| Thickness of nafion/membrane | 50.8 | μm |
| Current density of EC @1.82V | 1.285 | $A/cm^2$ |
| Anodic exchange current density of $IrO_2$ [43,44] | $4.62 \times exp(-48600/RT)$ | $A/cm^2$ |
| Cathodic exchange current density of Pt [43,48] | $142.02 \times exp(-28900/RT)$ | $A/cm^2$ |

*This value is used unless otherwise specified. We have two material choices for PV- 1: a thin film triple junction aSi-ucSi-ucSi, and 2: a III-V based dual junction $Ga_{0.51}In_{0.49}P$-GaAs cell. The reference case I refers to material choice 1 and case II refers to material choice 2. The optical thicknesses for these cells are examples which were not optimized.

FIGURE 7

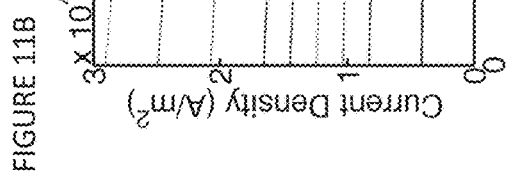
FIGURE 11B
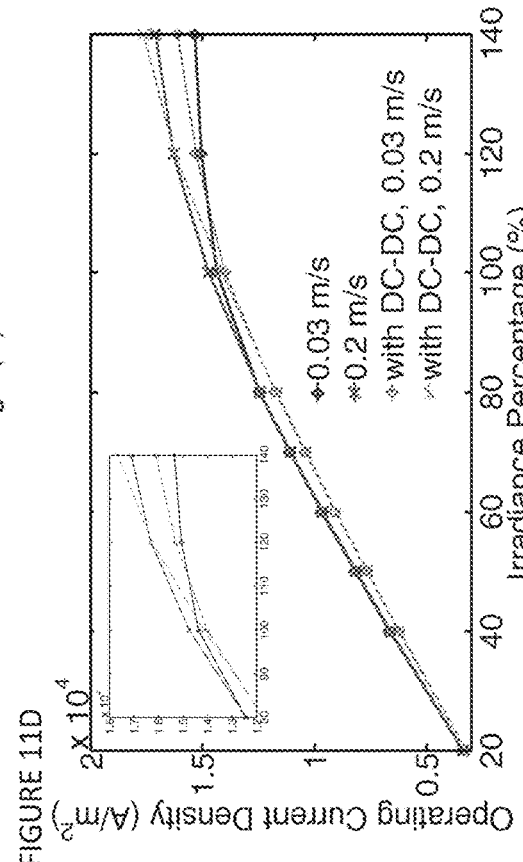
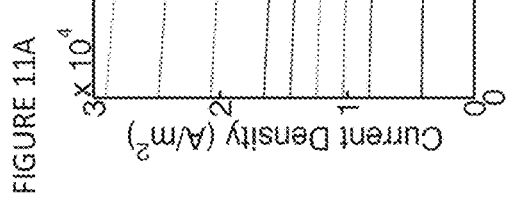
FIGURE 11A
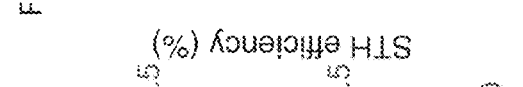
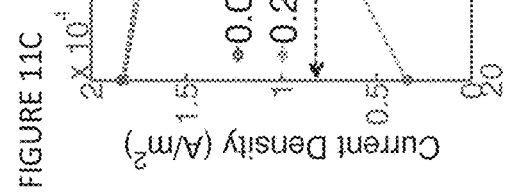

INTEGRATED PHOTO-ELECTROCHEMICAL DEVICE FOR CONCENTRATED IRRADIATION

CROSS-REFERENCE TO RELATED APPLICATIONS

This application is a divisional application of U.S. patent application Ser. No. 16/325,743 filed on Feb. 15, 2019, which is the U.S. national phase of International Application No. PCT/IB2017/055019 filed on Aug. 18, 2017, which designated the U.S. and claims the benefit of U.S. Provisional Application No. 62/376,923 filed on Aug. 19, 2016, and claims priority to European Application No. EP16020308.9 filed on Aug. 19, 2016, the entire contents of each of which are hereby incorporated herein by reference.

FIELD OF THE INVENTION

The present invention relates to renewable fuel processing and chemical commodity processing and energy storage systems or more generally to alternative energy production systems and more particularly, to integrated photo-electrochemical cells or integrated photo-electrochemical devices for operation with concentrated solar radiation.

DISCUSSION OF THE BACKGROUND ART

The solar energy received on earth's surface, capable of meeting mankind's current and future energy demands, can be directly converted into electricity using photovoltaic cells. However, electricity is difficult and costly to store, and considerable losses are accrued when attempting to distribute it over long distances. This problem can be circumvented by directly converting the solar energy into fuels or other chemical commodities.

One reaction considered is the electrolysis of water to produce hydrogen. Hydrogen can become a complementing energy carrier, and can be used, among others, as an energy-rich reagent for the exothermic formation of methane, methanol, or hydrocarbons using atmospheric $CO_2$ as a carbon feedstock. To realize this goal, practical means for sustainable hydrogen production are needed. Today more than 95% of global hydrogen production is based on steam reforming of fossil fuels.

A promising sustainable approach to hydrogen, for example, production is solar driven, using integrated photo-electrochemical (IPEC) pathways. Other photo-driven electrochemical reactions can be conducted as well, these include but are not limited to carbon dioxide reduction and ammonia production.

SUMMARY

In view of the above, the present disclosure concerns an integrated photo-electrochemical device according to claim 1. Other advantageous features can be found in the dependent claims. The present disclosure also concerns a photo-electrochemical system according to claim 9, a system according to claim 13, and a method for generating a gas, a liquid or a solid using concentrated electromagnetic irradiation according to claim 20.

Concentrating solar irradiation for use in integrated photo-electrochemical devices provides an economically competitive pathway for, for example, hydrogen generation. A concentrated irradiation IPEC (CIPEC) can use rare material components and still show economic competitiveness. Heat transfer and thermal management are important in these devices. With dedicated thermal management, a detailed 2-dimensional multi-physics modeling carried out by the inventors predicted the feasibility of the approach, high performance, and provided optimization guidance. Additionally, concentrated irradiation IPEC approaches combined with smart thermal management provide a pathway for the design of devices which are less sensitive to limitations imposed by single materials and components.

Two competing operational parameter spaces of CIPEC are observed: i) thermal effects enhance performance in the zone of low operational current density, and ii) mass transport limits dominate in the zone of high operational current density (saturation current of the electroyser component). These competing effects lead to tradeoffs between device efficiency and, for example, hydrogen evolution rate, which is quantified.

Smart thermal management—only possible through integrated device design—helps in achieving efficient and low cost production of solar fuels, and further alleviates performance decreases over the lifetime of the device, decreases experienced—for example—because of the degradation of components. The CIPEC device design or characteristics, implemented based on the optimization and design guidelines generated from the 2D coupled multi-physics model of the inventors, is disclosed. Proof of concept of the CIPEC design and a flow based controller for alleviating transient effects (for example long term degradation or short term irradiance transient effects) are also disclosed.

The CIPEC device of the present disclosure profits from the exclusion of direct semiconductor-electrolyte interfaces prone to interface degradation issues, and limits the transmission losses occurring in completely unintegrated, externally wired photovoltaic plus electrolyser systems.

According to one aspect of the present disclosure, the design incorporates an electronic conductor for the transfer of charge carriers from the photoabsorber to the reaction site—as contrasted with devices designed with an ionic conductor—in order to reduce the overpotentials and to benefit from larger conductivities.

A key issue for the economic competitiveness of PEC devices is the reduced use of rare and expensive device components, such as catalysts and light absorbers, which is addressed through concentrating the solar irradiation. Two examples (Akihiro Nakamura, Yasuyuki Ota, Kayo Koike, Yoshihide Hidaka, Kensuke Nishioka, Masakazu Sugiyama and Katsushi Fujii, Applied Physics Express, 8(10), 107101-107104 (2015); and Peharz, G., Dimroth, F., & Wittstadt, U, International Journal of Hydrogen Energy, 32(15), 3248-3252 (2007)) of experimental investigation of non-integrated PEC devices using concentrated irradiation demonstrate that very interesting efficiencies can be achieved. However, irradiation concentration leads to driving current densities which are approximately proportional to the concentration factor, thus inducing larger overpotentials and possible mass transport limitations.

Optical concentration generally increases the device temperature and consequently enhances the kinetics and the ionic transport in the solid electrolyte (its (e.g. nafion's) conductivity drops, however, at temperatures above 120° C. due to membrane dry out), while reducing the performance of the photoabsorbers. The (concentrated) integrated photo-electrochemical device of the present disclosure allows heat transfer between the components: transferring heat from components whose performance suffers from high temperature operation to components whose performance benefits from high temperature operation. Therefore, the overall performance of the concentrated irradiation integrated photo-electrochemical (CIPEC) device can gain from smart thermal management, which is not possible (without losses) in a non-integrated system. Thermal management is therefore a rationale for CIPEC designs. Through dedicated modeling efforts, thermal management strategies together with design and operational guidelines are developed in order to maximize product (for example hydrogen) production, energetic efficiencies, device durability, and to minimize device size and cost.

Several PEC modeling efforts have focused on 1-dimensional isothermal investigations. (E.g. A. Berger and J. Newman, *Journal of the Electrochemical Society*, 161 (8), E3328-E3340 (2014); R. E. Rocheleau and E. L. Miller, *International Journal of Hydrogen Energy*, 22 (8), 771-782 (1997); Y. K. Gaudy and S. Haussener, *Journal of Materials Chemistry A*, (2016)). In Haussener et al. (S. Haussener, S. Hu, C. Xiang, A. Z. Weber, and N. S. Lewis, *Energy & Environmental Science*, 6 (12), 3605 (2013)), an isothermal model was used to predict the temperature-dependent performance behavior of PEC devices. None of the efforts were directed towards consideration of thermal management as an important design parameter. To incorporate this parameter, a fully automated coupled 2D multi-physics non-isothermal model has been developed by the inventors which uses finite element and finite volume methods to predict the performance of the concentrated irradiation IPEC device. The validated model accounts for: charge generation and transport in the multi junction solar cell and the components of the integrated electrochemical system (polymeric electrolyte and solid electrode), electrochemical reaction at the catalytic sites, fluid flow and species transport in the channels delivering the reactant (for example, water) and removing the products (for example, hydrogen and oxygen), and radiation absorption and heat transfer in all components. The gain in the performance of a CIPEC device has been quantified, incorporating heat transfer between the different components and thermal management to actively steer the heat transfer process. The model shows to be a valuable tool for the design of IPEC cells or devices under concentrated irradiation at elevated temperatures. It is the most detailed yet computationally economic model of an integrated photoelectrochemical device reported to date.

An example fully integrated prototype of the concentrated irradiation integrated PEC device is shown in FIGS. 8A to 8E, based on the optimization and design guidelines generated from the 2D coupled multi-physics model. For example, the $H_2$ production cost with this device is estimated to be around 1.5 $/kg of $H_2$. The prototype incorporates a PV (photovoltaic/photo absorber component) with area of 4 cm² and an EC (electrolyser/electrochemical component) with area of 25 cm² and works at high irradiation concentration (e.g. C=800, making it a 270 W system generating hydrogen at a rate of 1.4 g/hour). The details of this CIPEC device are disclosed below.

In some embodiments the integrated device incorporates or is configured to carry out electrolysis of water, the reduction of carbon dioxide, the electrochemical production of ammonia, water purification, the electrochemical production or purification of metals, or the electrochemical production of a chemical commodity in liquid/gas/solid form.

In some embodiments the reactant or water channel/channels is/are on top or beneath/around the photovoltaic or photoabsorber (PV) component.

In some embodiments the PV component is III-V material based, thin film Si based or Heterojunction Si based device.

In some embodiments the PV component is dye-synthesized solar cell based, perovskite material based or organic material based device.

In some embodiments the PV component is the multijunction or mechanically stacked solar cell providing sufficient driving potential (~2 V) to the connected electrolyser component.

In some embodiments the electrolyser or electrochemical (EC) component incorporates Ni/Co based catalysts.

In some embodiments the EC component incorporates (includes) Pd, Pt, Rh, Ir, Re, Os, Ru, or Ni based catalysts for Hydrogen evolution reaction. These catalysts can in some cases be functionalized with molecular components.

In some embodiments the EC component incorporates (includes) Cu, Ag, Sn, or Au based catalysts or bi-elemental catalysts for $CO_2$ reduction reaction. These catalysts can in some cases be functionalized with molecular components.

In some embodiments the EC component incorporates Ir, Ru, Pd, Rh, Pt, Au, or Nb based catalysts and/or their oxide based catalysts for Oxygen evolution reaction. These catalysts can in some cases be functionalized with molecular components.

In some embodiments the EC component incorporates a nafion membrane or a proton exchange membrane which facilitates conduction of protons while acting as an electronic insulator and reactant barrier.

In some embodiments the EC component incorporates an anion conducting membrane or an bipolar membrane.

In some embodiments the EC component incorporates no separator or membrane between anodic and cathodic sides.

In some embodiments the EC component incorporates carbon fiber or Pt—Ti based porous structures for gas diffusion layers.

In some embodiments the EC component incorporates Ti, steel or graphite based anodic or cathodic flow plates uncoated or coated with high conductive materials like Ag/Au.

In some embodiments the CIPEC device incorporates a p-n-cathodic-anodic or n-p-anodic-cathodic configuration.

In some embodiments an electrically conducting paste, thermal bonding, or soldering/welding is used for contacting PV's n (p) terminal to the cathode (anode).

In some embodiments the cooling water channel assembly is made of metal and/or alloy (e.g. steel/Al) or a thermoplastic material (e.g. PC/PPSF/PC-ABS).

In some embodiments the cooling water channel assembly incorporates single, dual or multiple inlets for the reactant.

In some embodiments the cooling water channel assembly incorporates multiple symmetrically or assymetrically positioned inlets for the reactant.

In some embodiments the cooling water channel assembly incorporates 1/2/3 or more similar/different channels in symmetric/assymetric fashion.

In some embodiments the single/dual inlets for reactant are fed from top, bottom, or sides of the cooling water channel assembly.

In some embodiments the anodic-cathodic flow plates incorporate twice, thrice or multiple of number of channels in cooling water channel assembly leading to a uniform or non-uniform and laminar or turbulent flow distribution of reactant in the anodic-cathodic reaction chambers.

In some embodiments the anodic-cathodic flow plates incorporate single or dual or multiple inlets and outlets.

In some embodiments the cathodic flow plate incorporates 1, 2, multiple or no inlets for sweeping gas/liquid.

In some embodiments the flow plates are assembled using electrically masked metal/alloy screws or plastic/polymer based screws.

In some embodiments the screws for tightening the flow/electrolyser plates pass through the respective plates and in some embodiments they don't pass through the flow/electrolyser plates.

In some embodiments the CIPEC device incorporates teflon or silicone based (or any electrically insulating) material for gasketing and sealing.

In some embodiments a CIPEC system incorporates the CIPEC device and a controlling unit for performance optimisation.

In some embodiments the CIPEC system incorporates a controlling unit for reactant flow rate based optimum power point tracking.

In some embodiments the controlling unit incorporates maximum power point calculator or maximum current calculator employing techniques based on hill climbing principle, fuzzy logic control, neural network, fractional open circuit voltage or short circuit current and current sweep principles.

In some embodiments the controlling unit incorporates a PID controller, microprocessor or microcontroller.

In some embodiments the controlling unit incorporates a liquid/gas mass/volume flow controller and flowmeter to measure and control the flow rate/velocity of the reactant.

In some embodiments the controlling unit incorporates a slew drive/motor to move the device in or out of the solar concentrator focus, or any other approach to dynamically adjust the concentration magnitude and distribution.

In some embodiments the CIPEC device incorporates a mechanical or electronic switch to change the device from an integrated mode to a non-integrated mode where there is no electrical connection between photovoltaic and electrochemical component.

In some embodiments the CIPEC system incorporates the compressed/uncompressed storage of hydrogen in a liquid/gas phase in a physical (eg. hollow metal tank) or chemical (e.g metal hydride tank) storage unit.

In some embodiments the CIPEC system incorporates the channels beneath/around the storage system to collect/transfer/exchange heat using a fluid/gas between the CIPEC device and storage system.

In some embodiments the CIPEC system incorporates a line focusing or point focusing concentrator or in particular a parabolic dish, parabolic trough, tower, linear Fresnel reflector, linear Fresnel lens, compound parabolic concentrator or point focus Fresnel lens based unit/waveguide/panel for a concentrator and/or tracking system.

In some embodiments the concentrator system incorporates single axis, dual axis or self tracking principles for the tracking system.

In some embodiments the tracking system incorporates a moving collector or fixed collector (moving mirror) principle.

In some embodiments the concentrator system incorporates the channels beneath/around the concentrator to collect waste heat using a fluid/gas from the concentrator and transfer it to the CIPEC device inlet.

In some embodiments the concentrator system incorporates a flux homogenizer made up of a combination of optical lenses or compound optical mirrors to homogenize the flux incident on the target/device.

In some embodiments the concentrator system incorporates an aperture controller to control the active area of the photoabsorber and consequently the amount of the products or the operating point of the system.

The example device is shown for the photo-electrochemical splitting of water, but is not however limited to this operation, the device of this disclosure can be used in other electrochemical pathways such as for example $CO_2$ reduction or ammonia production.

The above and other objects, features and advantages of the present invention and the manner of realizing them will become more apparent, and the invention itself will best be understood from a study of the following description with reference to the attached drawings showing some preferred embodiments of the invention.

A BRIEF DESCRIPTION OF THE DRAWINGS

FIG. 1A and FIG. 1B are exemplary schematics (not to scale) showing (FIG. 1A) the top view and (FIG. 1B) the side view of an IPEC device for receiving concentrated irradiation of the present disclosure and depicting incoming concentrated irradiation, cooling and preheating water channel, triple/dual-junction PV, and the integrated electrochemical system consisting of anodic and cathodic channels, gas diffusion layers (GDL), catalyst layers, and a polymeric electrolyte (for example, Nafion), the 2D simulation domain is the plane shown in FIG. 1A, water from the top water channel is fed to the anodic chamber shown in FIG. 1A with white arrows, the PV's top p-type contact is connected to a titanium flow plate of the anode side via an electronic conductor, providing flow of positive charge (holes), shown in FIG. 1B with dark gray color;

FIG. 2 shows a Simulation flow of the IPEC device, Arrows show interaction among the subroutines solving for multiple physics and corresponding conservation and transport equations, the interaction with AMPS (Analysis of Microelectronic and Photonic Structures) tool is only for the cases involving a-Si/uc-Si based PV, T and u represents the temperature field and velocity vector, respectively, in concerned region, $G_{opt}$ is the optical generation rate, $\sigma$ is the electrical conductivit, $wH_2O$ is the water mass fraction/concentration and $Rec_d$ recombination profile due to defect states, $\varepsilon_{rr}$ is the tolerable error in temperature for simulation convergence taken to be 0.1 K;

FIGS. 3A to 3E are Contour plots showing the evolution of (FIG. 3A) hydrogen production rate [g/min/m$^2$], (FIG. 3B) Solar-to-Hydrogen (STH) efficiency, (FIG. 3C) average PV temperature [K], and (FIG. 3D) average EC temperature [K], as a function of varying irradiation concentrations and water mean flow velocities for aSi-ucSi-ucSi based IPEC, FIG. 3E shows the Operating STH efficiency for varying mean flow velocities and irradiance concentration (C) as a function of hydrogen production rate, the Pareto front in FIG. 3E is shown by the dotted black line, the circles represents concentration and the stars represents the mean flow velocity [m/s];

FIGS. 4A to 4D show Characteristic curves for mass flow rate analysis for a-Si/uc-Si based PV case showing formation of two characteristic regions of operation, for irradiation concentrations of (FIG. 4A) C=18, (FIG. 4B) C=124, (FIG. 4C) C=546, and (FIG. 4D) C=1000;

FIGS. 5A and 5B are Contour plots showing the STH efficiency enhancement in percentage with respect to the reference case for (FIG. 5A) the thin film triple junction aSi-ucSi-ucSi, and (FIG. 5B) the $Ga_{0.51}In_{0.49}P$—GaAs dual junction based integrated PEC device, the reference velocity, $v^0_{mean}$, is 0.2 m/s, $\eta^0_{STH}$ is the STH efficiency at 0.2 m/s for the corresponding concentration, The contour line represents the 0 level, $\eta^0_{STH,C=1}$=4.94%, $\eta^0_{STH,C=18}$=4.74%, $\eta^0_{STH,C=124}$=4.67%, $\eta^0_{STH,C=265}$=4.49%, $\eta^0_{STH,C=546}$=3.80%, $\eta^0_{STH,C=707}$=3.08%, $\eta^0_{STH,C=1000}$=2.22% for the thin film Si case. $\eta^0_{STH,C=1}$=12.21%, $\eta^0_{STH,C=53}$=12.20%, $\eta^0_{STH,C=180}$=12.18%, $\eta^0_{STH,C=265}$=8.48%, $\eta^0_{STH,C=546}$=4.13%, $\eta^0_{STH,C=707}$=3.20%, $\eta^0_{STH,C=1000}$=2.25% for the III-V based PV case;

FIGS. 6A to 6D shows Operating STH efficiency for varying (FIG. 6A) exchange current density multipliers, (FIG. 6B) nafion membrane thicknesses, (FIG. 6C) anodic and cathodic catalyst thickness, (FIG. 6D) anodic and cathodic GDL thickness as a function of hydrogen production rate, the Pareto front is shown by the dotted black line, the circles represents concentration and the stars represents the (FIG. 6A) exchange current density multiplier, (FIG. 6B) membrane thickness, (FIG. 6C) catalyst thickness and (FIG. 6D) GDL thickness, the reference exchange current density for anode and cathode are given in FIG. 7;

FIG. 7 shows a summary of baseline parameters used in the simulations for reference case I and II;

Figure 12A:
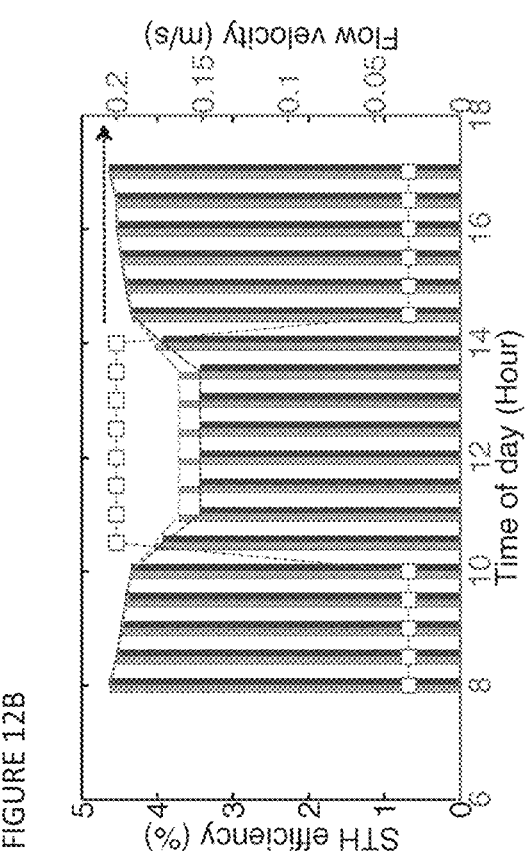
Figure 12B:
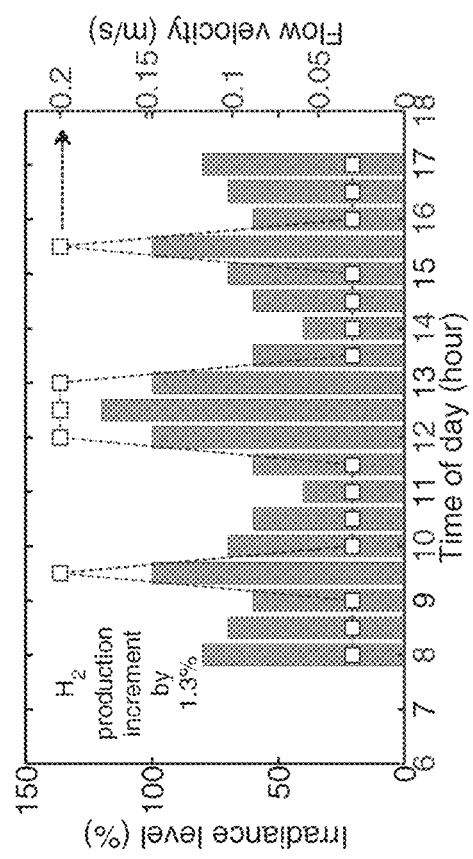
Figure 12C:
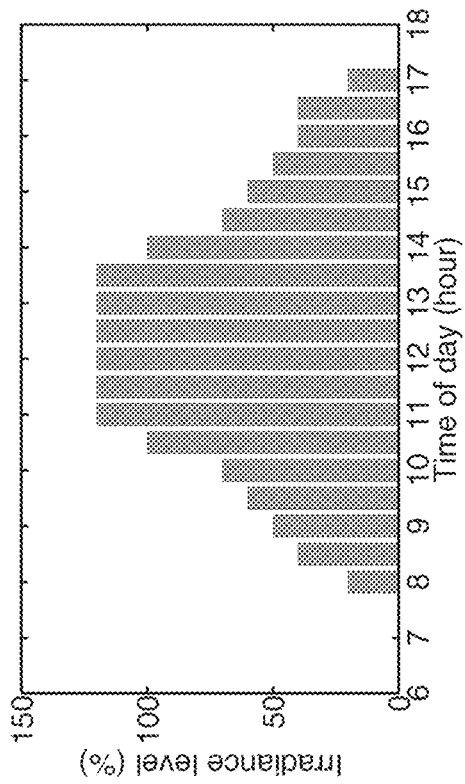
Figure 13A:
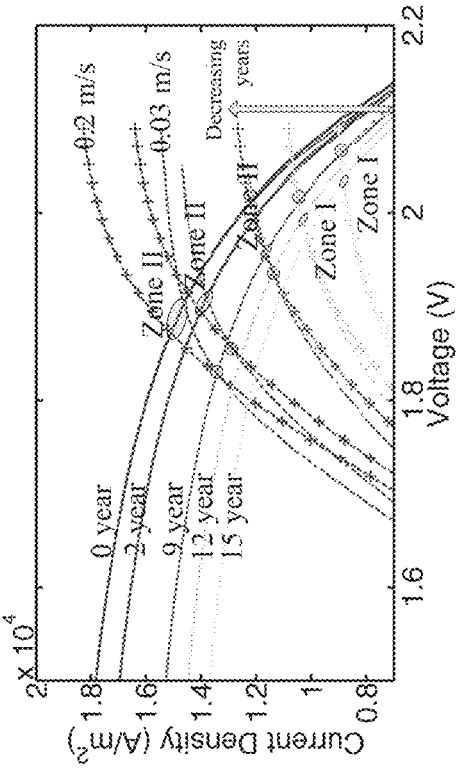
Figure 13B:
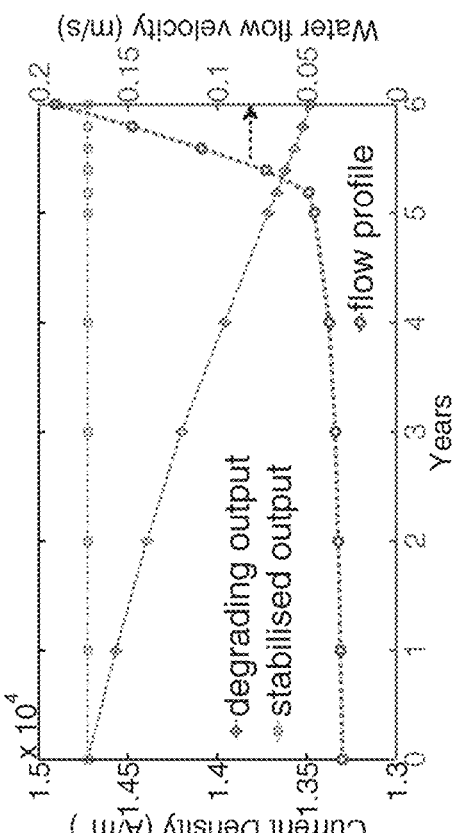
Figure 13C:
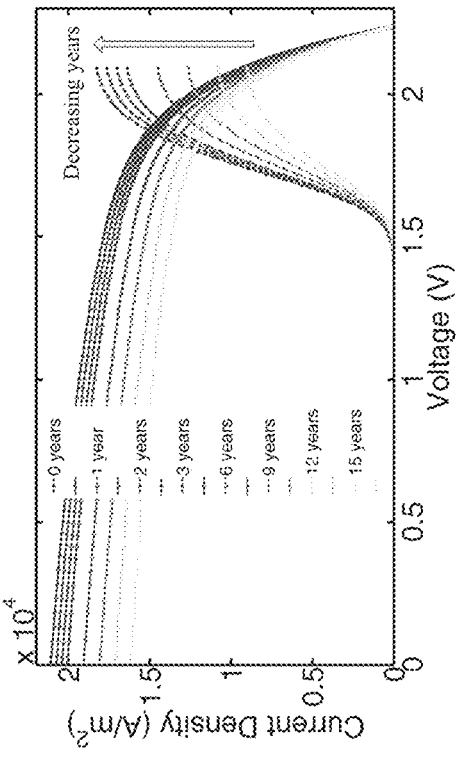
Figure 13D:
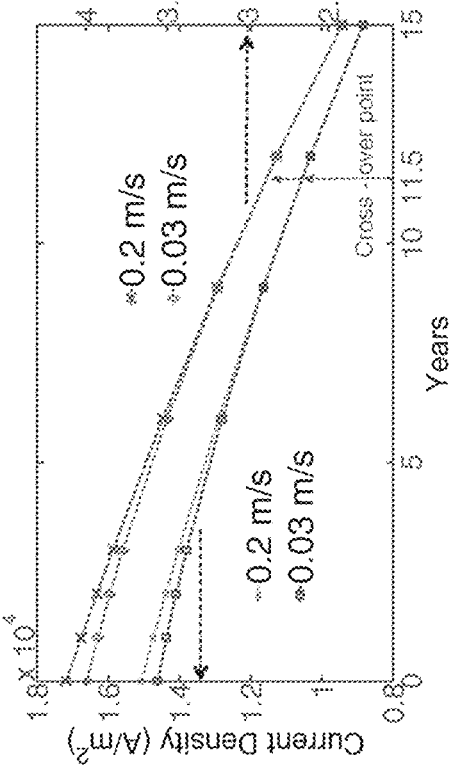
Figure 14A:
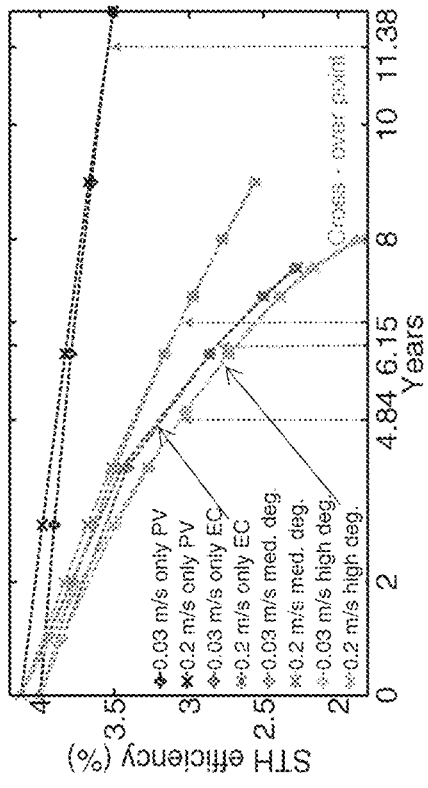
Figure 14B:
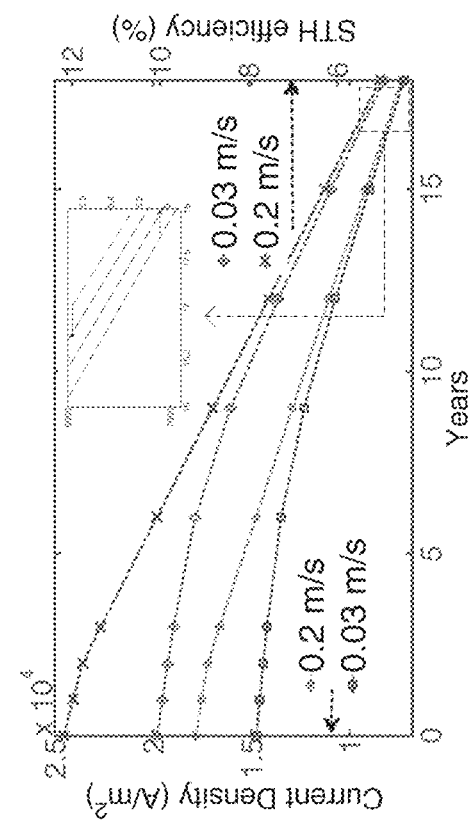
Figure 15B:
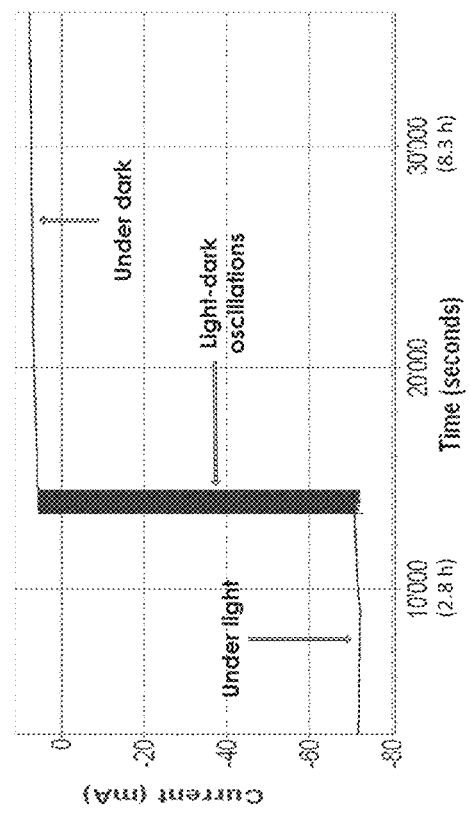
Figure 15D:
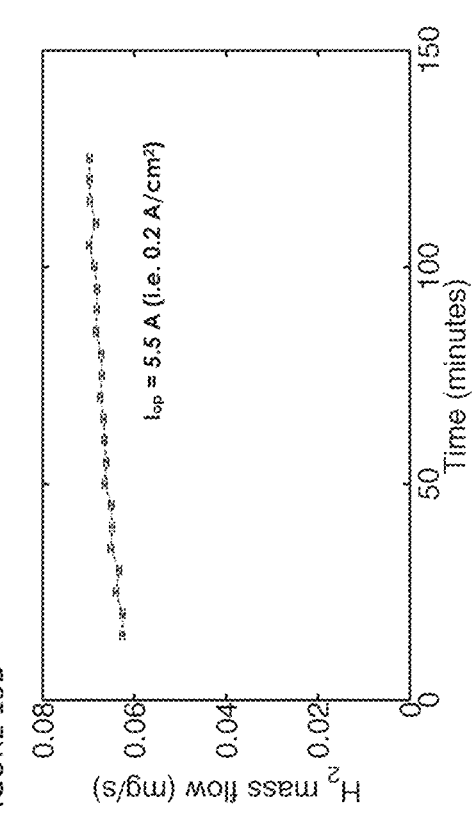
Figure 15A:
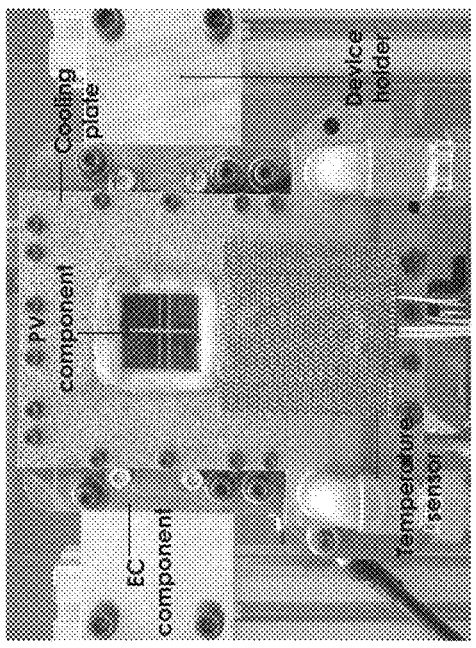
Figure 15C:
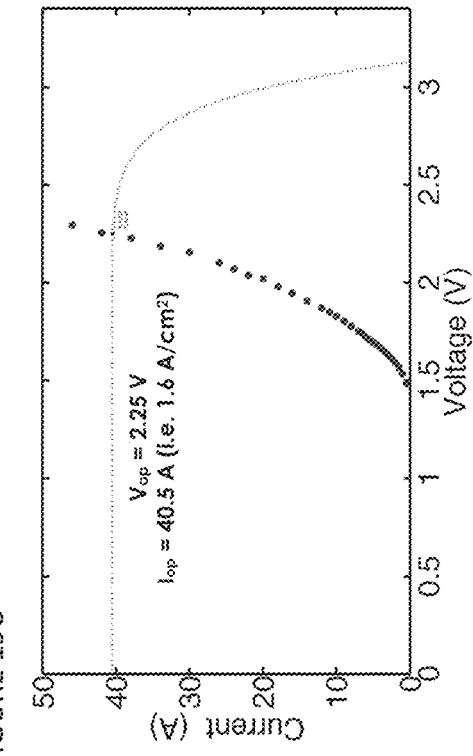

FIGS. 11A to 11D are plots showing the characteristic curves (FIG. 11A) with 0.03 m/s, (FIG. 11B) 0.2 m/s for the thin film Si based IPEC device with varying irradiance levels, the maximum power point (MPP) of the PV component is shown with the circle, the variation of operating current density and STH efficiency is presented in FIG. 11C; and FIG. 11D shows the operating current density comparisons for non DC-DC and DC-DC based maximum/optimum power point tracker;

FIGS. 12A to 12D are plots showing three different daily irradiance profiles, the STH efficiency variation for the profile in FIG. 12A for the flow velocity of 0.2 and 0.03 m/s is shown in FIG. 12B, the respective flow velocity controlling profiles are shown;

FIGS. 13A to 13D are plots showing the characteristic curves of triple junction thin film Si based IPEC device at C=450 suns for (FIG. 13A) 0.2 m/s water flow inlet velocity, the zoomed plot showing the overlap of 0.03 m/s and 0.2 m/s case is presented in FIG. 13B, the variation of operating current density and STH efficiency with time is presented in FIG. 13C, the plot of FIG. 13D shows the operating current density, stabilised current density and respective water flow velocity profile (right y axis) for III-V material dual junction based IPEC device working at C=180 suns;

FIGS. 14A and 14B are plots (FIG. 14A) showing the profiles of operating current density and STH efficiency for GaInP—GaAs dual junction PV based IPEC device at C=180 suns with increasing operational years, the inset shows zoomed plot from 17 to 18 years showing that the two mass flow rate curves never intersect, the plot FIG. 14B shows the STH efficiency curves with increasing years for the thin film Si based IPEC device for the cases where we consider only PV degradation, only EC degradation, and medium/higher degradation rates, the cross-over points (shown on year i.e. x-axis) for the two flow rates are different for all these cases; and FIGS. 15A to 15D show the implemented CIPEC device in FIG. 15A, the plot of FIG. 15B shows the stability of the prepared PV module under de-ionized water where the PV module is biased at a particular voltage and it's output current is measured for varying time, the characteristics curves of the CIPEC device at designed optimum working point are shown in FIG. 15C and the measured produced output flow rate for the integrated device operation for ~2 hours is shown in FIG. 15D.

Herein, identical reference numerals are used, where possible, to designate identical elements that are common to the figures.

DETAILED DESCRIPTION OF SEVERAL EMBODIMENTS

Figure 1A:
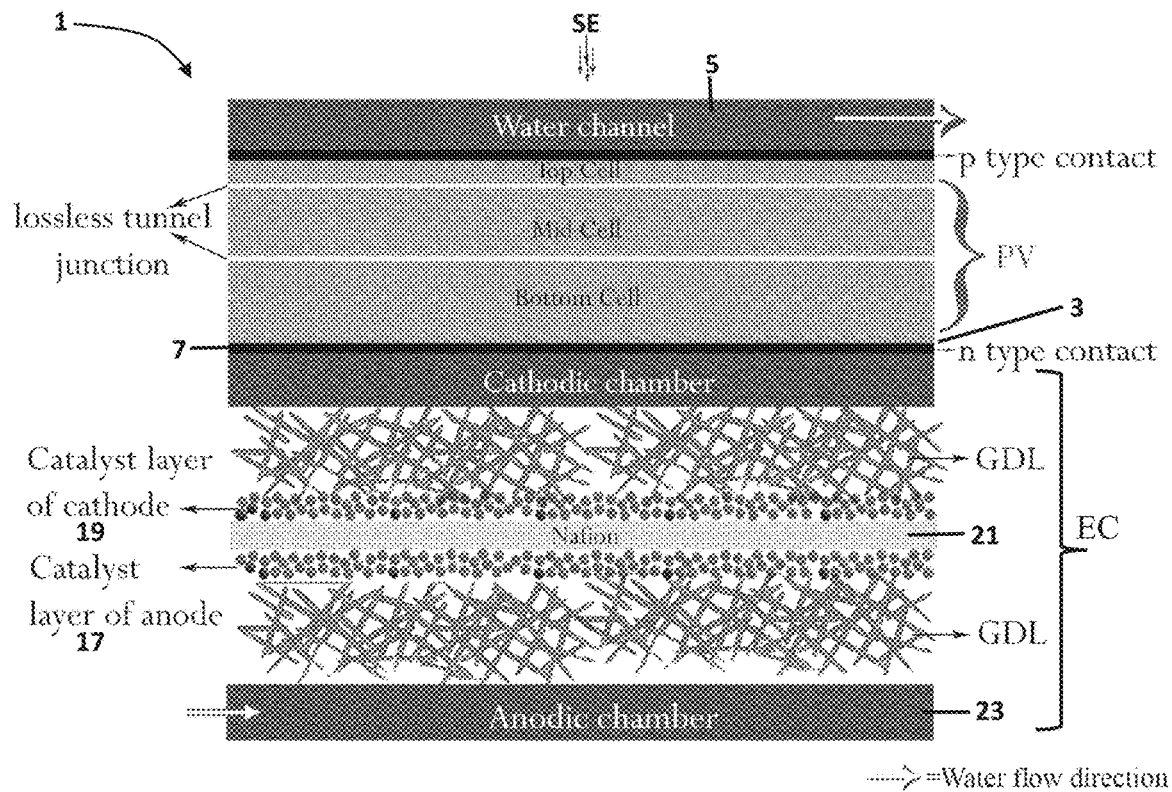
Figure 1B:
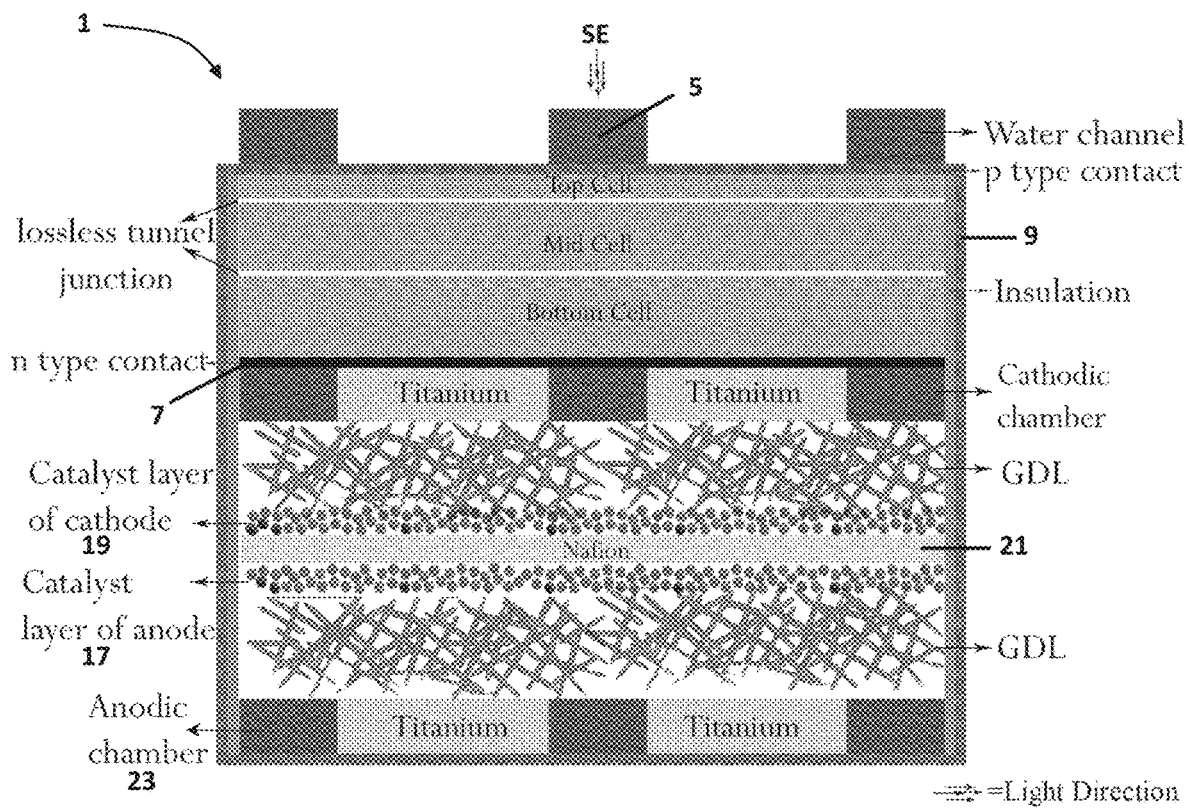

FIGS. 1A to 1B schematically show an exemplary IPEC device 1. The integrated photo-electrochemical device 1, which is configured to receive electromagnetic irradiation or concentrated electromagnetic irradiation SE, includes a photovoltaic device PV configured to generate charge carriers from the concentrated electromagnetic irradiation and an electrochemical device EC configured to carry out electrolysis of a reactant.

The photovoltaic device PV contacts the electrochemical device EC at a solid interface 3 to form the integrated photo-electrochemical device. The integrated photo-electrochemical device 1 further includes at least one reactant channel 5 extending between the photovoltaic device PV and the electrochemical device EC to transfer both heat energy and the reactant from the photovoltaic device PV to the electrochemical device EC.

The reactant channel 5 extends directly between the photovoltaic device PV and the electrochemical device EC to directly transfer heat energy and the reactant from the photovoltaic device PV to the electrochemical device EC.

The reactant channel 5 or channels 5 can be on top or beneath/around the photovoltaic or photoabsorber (PV) component.

The photovoltaic device PV and the electrochemical device EC both, for example, define a solid planar structure. An outer solid plane of the photovoltaic device PV is connected to an outer solid plane of the electrochemical device EC.

The photovoltaic device PV can include an n-type or p-type semiconductor contact layer 7 and the n-type or p-type semiconductor contact layer 7 defines an interface with the electrochemical device EC.

An electrical conducting paste, thermal bonding, or soldering/welding can be used for contacting the n or p terminal of the photovoltaic device PV to the cathode or anode.

The PV device or component can be (or include), for example, III-V material based, thin film Si based or Heterojunction Si based device or alternatively can be dye-sysnthesized solar cell based, perovskite material based or organic material based device.

The PV device or component can include or be a multi-junction or mechanically stacked solar cell providing sufficient driving potential (for example ~2 V) to the connected electrolyser EC component.

The integrated photo-electrochemical device 1 can further include a conductive pathway 9 between the photovoltaic device PV and electrochemical device EC for transporting generated charge carriers from the photovoltaic device PV to the electrochemical device EC.

The reactant channel 5 can extend across the photovoltaic device PV to act as an anti-reflection coating for the incident concentrated electromagnetic irradiation received by the photovoltaic device PV.

The integrated photo-electrochemical device 1 can include for example one or preferably at least two reactant inlets 11 (see FIGS. 8A to 8E). The device 1 can also include a plurality of reactant channels 5 in fluid connection with the at least two reactant inlets 11 to permit a wide range of reactant flow rates in the device 1. The device 1 may also include one or preferably at least two reactant/product outlets 15 (see FIGS. 8A to 8E) to permit a wide range of gas flow rates.

The electrolyser or electrochemical EC device or component can include Ni/Co based catalysts. The electrochemical device EC can include Pd, Pt, Rh, Ir, Re, Os, Ru, or Ni based catalysts for a hydrogen evolution reaction. These catalysts can be modified or functionalized with molecular components.

The electrochemical device or component EC can include Ir, Ru, Pd, Rh, Pt, Au, or Nb based catalysts and/or their oxide based catalysts for an oxygen evolution reaction. These catalysts can be modified or functionalized with molecular components.

The electrochemical device EC can incorporate the oxidation catalyst on the anode and reduction catalyst on the cathode for electrochemical production of a chemical commodity in solid, liquid or gas form.

The electrochemical device or component EC can include for example a nafion membrane 21 or a proton exchange membrane 21 which facilitates conduction of protons while acting as an electronic insulator and reactant barrier.

The electrochemical device or component EC can include for example an anion conducting membrane 21 or an bipolar membrane 21.

The electrochemical device or component EC may be separator-less or membrane-less and include no separator or membrane between the anodic and cathodic sides of the electrochemical device or component EC.

The electrochemical device or component EC can include carbon fiber or Pt—Ti based porous structures for gas diffusion layers GDL.

The photo-electrochemical device 1 can include a cooling channel assembly 39, an anodic flow plate 27 and a cathodic flow plate 29 (see for example FIGS. 8A to 8E).

The electrochemical device or component EC can include for example Ti, steel or graphite based anodic or cathodic flow plates 27, 29 that can be uncoated or coated with high conductive materials, for example, Ag and/or Au.

In some embodiments the cooling water channel assembly 39 is made of metal and/or alloy (e.g. steel/Al) or a thermoplastic material (e.g. PC/PPSF/PC-ABS).

The cooling water channel assembly 39 can comprise single or dual inlets 11 for the reactant. The inlets 11 may be multiple symmetrically or assymetrically positioned inlets for the reactant.

The cooling water channel assembly 39 can include 1, 2, 3 or more similar or different channels disposed in a symmetric or assymetric manner.

The single or dual inlets 11 for the reactant can be located on and fed from the top, bottom, or sides of the cooling water channel assembly 39.

The anodic or cathodic flow plates 27, 29 can include twice, thrice or multiple number of channels in cooling water channel assembly 39 to produce a uniform or non-uniform, and laminar or turbulent flow distribution of the reactant in the anodic and/or cathodic reaction chambers of the electrochemical device or component EC.

The anodic or cathodic flow plates may include single, dual or multiple inlets and outlets.

The cathodic flow plate 29 can include one, two or multiple or no inlets for sweeping a gas or liquid.

The flow plates 27, 29 can be assembled using electrically masked or isolated metal/alloy screws or using plastic/polymer based screws.

The screws for tightening the flow/electrolyser plates may pass through some or all the respective plates or not pass through some of the flow/electrolyser plates.

The device 1 may include teflon or silicone based (or any electrically insulating material) material for gasketing and sealing.

In the exemplary CIPEC device shown in FIG. 1B, the incoming concentrated irradiation SE is incident on the photoabsorber through the reactant (for example, water) channel 5. The absorbed photons with energies larger than the bandgap allow for the generation of charge carriers in the photoabsorber. The holes, coming from the p-side of the photovoltaic device PV travel to the anodic catalyst 17, cause the oxidation of the reactant, that is water in this exemplary case, to produce oxygen and protons. The electrons travel from the n-side of the photovoltaic device PV to the cathodic catalyst 19 and reduce the protons, which have traveled through a membrane 21, for example, a Nafion membrane, causing hydrogen evolution. The reactant (for example, water) from the top channel 5 removes the heat from the photovoltaic device PV and this heat energy is subsequently fed to an inlet, for example, of the anodic chamber 23 of the electrochemical system EC, providing a pre-heated reactant.

The CIPEC device's functioning is not limited to the photo-electrochemical production of hydrogen, but in general extends to the photo-electrochemical production of any chemical commodity in liquid, gas or solid form. For example, CIPEC can also be deployed for reduction of $CO_2$. The anolyte (e.g. 1 mol/L KOH aqueous solution) flows through the cooling channel assembly 39. For this particular example the anolyte is not passed above the PV but guided around it in fluidic connection to the channels of the anodic flow plate 27. The excess heat of the PV is removed through the anolyte from the back side where the anolyte is directly fed to the reaction site. The water from the anolyte is oxisdised at the catalyst's surface (e.g. $IrO_2$ or $RuO_2$) to produce $O_2$ and protons. Oxygen evolution reaction causes the generation of $H^+$ ions which travel through the (polymeric) membrane to the cathodic side. The electrons from the oxygen evolution reaction OER travel via the photovoltaic device PV to the cathodic flow plate 29 (and hence cathodic catalyst 19) through the electronic conductor 33. The dissolved $CO_2$ in aqueous catholyte (e.g. 0.45 mol/L $KHCO_3$+0.5 mol/L KCl) entering through the sweeping fluid inlet of FIG. 8A, flows through the cathode channel and gets reduced at the catalyst's surface (e.g. Cu, Sn or Pd) into a formate product ($CO_2+2H^++2e^-\rightarrow HCOOH$). The integrated photo-electrochemical device 1 of the present disclosure is further disclosed below, for example, in relation to FIGS. 8A to 8E.

The integrated photo-electrochemical device 1 can be part of a photo-electrochemical system S1 including the photo-electrochemical device 1 and an electromagnetic energy/irradiation concentrator device or system 25 (see, for example, FIG. 9) configured to focus or concentrate electromagnetic energy or irradiation on the integrated photo-electrochemical device 1.

The electromagnetic energy/irradiation concentrator device or system 25 can include for example a line focusing or point focusing concentrator. The system S1 may include, for example, a parabolic dish (see FIG. 9), a parabolic trough, a tower, a linear Fresnel reflector, a linear Fresnel lens, a compound parabolic concentrator or a point focus Fresnel lens based unit/waveguide/panel to concentrate electromagnetic energy or irradiation on the device 1.

The photo-electrochemical system S1 can also include a tracking system TS configured to track a movement of a solar energy source for example. The tracking system TS can be, for example, configured for single axis tracking, dual axis tracking or self tracking. The tracking system TS may include, for example, a moving collector moving relative to the integrated photo-electrochemical device 1 or a fixed collector fixed relative to the integrated photo-electrochemical device 1 and both the integrated photo-electrochemical device 1 and the fixed collector are displaced simultaneously during tracking.

The self-tracking system is, for example, configured to determine changes in the concentrated incident irradiation intensity on the photo-electrochemical device 1 and to displace at least one element (for example, the focusing element or both the focusing element and the device 1) of the concentrator system 25 to optimise or maximise the concentrated incident irradiation intensity on the photo-electrochemical device 1. The self-tracking system, for example, includes or consists of a cylindrical bed filled with phase changing material (PCM) like paraffin wax which absorbs the (longer wavelength) infra-red (or above infra-red) part of the spectrum being split from the dichroic prism layer sitting above it and causes the actuation (vertical expansion) of the cylinders which leads to the other split part that is the one comprising of the wavelengths below infra-red to be trapped (due to total internal reflection) inside a glass waveguide situated above the prism layer and effectively travelling towards the IPEC device 1. With the movement of the sun/input light source different PCM cylinders are actuated causing the light trapping in the waveguide and effective tracking of the light source.

The concentrator device or system 25 can include, for example, a flux homogenizer made up of or comprising a combination of optical lenses or compound optical mirrors to homogenize the flux incident on the target/device 1.

The concentrator system 25 can also include channels located beneath or around the concentrator 25 to collect waste heat using a fluid/gas circulating in these channels of the concentrator and transfer the collected heat to an inlet of the device 1, and for example to the electrochemical device EC.

The photo-electrochemical system S1 or concentrator system can include a slew drive/motor to move the target/device 1 in and out of the focus of the concentrator to dynamically adjust the magnitude of concentration or distribution of the incoming irradiation.

The concentrator system 25 can include an aperture contoller made up of, for example, two L-shaped shutters or a diaphragm shutter. The aperture controller can be controlled by the control unit depending on the working conditions particularly related to the production and demand matching and as a safety component to avoid the over-filling of the storage and over-heating of the system. The aperture controller can be part of the homogenizer or a separate component. The integrated photo-electrochemical device 1, or the photo-electrochemical system S1 can also be part of a system further including a physical or chemical storage unit configured to store a product in a liquid or gas phase. The system can include channels configured to collect/transfer/exchange heat, using a fluid or gas, between the integrated photo-electrochemical device 1 and the storage unit.

The storage unit may be, for example, for the compressed/uncompressed storage of hydrogen in a liquid or gas phase in a physical (eg. hollow metal tank) or chemical (e.g metal hydride tank) storage unit.

The system with or without storage unit can be operated at pressures above or below 1 atm.

2-D Non-Isothermal Multi-Physics Modeling

For electromagnetic (EM) wave propagation in any complex 2-dimensional geometry, the combined form of the Maxwell curl equations is solved for the simulation of the electromagnetic field using the finite element method and MUltifrontal Massively Parallel Sparse direct Solver (MUMPS). The net heat source term coming from EM wave propagation is defined to be the sum of the individual source and sink terms:

$$Q_{EM\lambda}^{PV} = Q_{TH} \mid^{\lambda < hc/E_g} + Q_R \mid^{\lambda > hc/E_g} + Q_M \mid^{\lambda > hc/E_g} \quad (1)$$

$$Q_R + Q_M = -\nabla \cdot S_{av\lambda} \mid^{\lambda > hc/E_g} \quad (2)$$

$$Q_{TH} = \left(1 - \frac{E_g}{h\nu}\right)(-\nabla \cdot S_{av\lambda})\bigg|^{\lambda < hc/E_g} \quad (3)$$

$Q_R$ are electrical (resistive) losses, $Q_M$ are magnetic losses, and $Q_{TH}$ are thermalization losses. For simulation domains not involving semiconductors, such as water, the net heat source is simply $Q_{EM\lambda} = -\nabla \cdot S_{av\lambda}$ where $S_{av}$ is the time-average pointing vector. The overall $Q_{EM}$ is calculated by summing the net heat source terms for individual wavelengths ($\lambda$). $E_g$ is the bandgap of the semiconductor with h and c being the planck's constant and speed of light in vacuum, respectively.

For the charge transport in the semiconductor (SC), the Poisson equation and current conservation equations are solved simultaneously using Fermi-Dirac statistics and a finite volume solver, incorporating the transport of electrons via the electron current density vector, $J_n$, and holes via the hole current density vector, $J_p$, where their sum gives the total current density. The internal heat source term in the semiconductor is given by $$Q_{PV} = J \cdot \nabla V + (E_g + 3k_B T)R, \quad (4)$$

where R is the net recombination. The first term ($J \cdot \nabla V$) represents the ohmic losses, and the second term ($E_g + 3k_B T$)R gives the recombination losses in the semiconductor where $k_B$ is the Boltzmann constant. Charge transport in the electrolyte is simulated by the current conservation and Nernst-Planck equations, obeying electro-neutrality. Ohm's law is used for the current conservation in the electrode. The electrochemical reaction at the electrode-electrolyte interface is accounted for via the reaction current, $i_{loc}$, modeled via the Butler-Volmer expression for the anodic one-step oxygen evolution reaction (OER),

and cathodic one-step hydrogen evolution reaction (HER),

The charge conservation equations in the electrode and electrolyte are solved via finite element methods and a MUMPS solver. The fluid flow and mass transport in the channels and the porous gas diffusion layers (GDLs) are modelled by the Navier-Stokes equation with Darcy extension. Species transport for the low density fluid mixture is modelled by the Maxwell-Stefan diffusion model. The water at the output of the water channel is fed to the anodic channel at its inlet with normal velocity, $v_{water}$. The heat source in the electrochemical system, comprised of electrode ohmic losses, electrolyte ohmic losses and kinetic losses, is given by Eq. 7 where $J_s$ ($J_l$) and $\varphi_s$ ($\varphi_l$) are the electrode (electrolyte) current density and electrode (electrolyte) potential, respectively.

$$Q_{EC} = -J_s \cdot \nabla \phi_s - J_l \cdot \nabla \phi_l + \left(\phi_s - \phi_l - E_{eq} + T\frac{\partial E_{eq}}{\partial T}\right)i_{loc}. \tag{7}$$

For heat transfer, the steady-state energy conservation equation is solved using finite element methods in order to calculate the temperature (T) field in the IPEC device 1. $Q_H = Q_{EM} + Q_{PV} + Q_{EC}$ describes the total heat source for the IPEC which includes the heat from electromagnetic heating, semiconductor transport, and electrochemical reactions.

For the yearly degradation analysis to incorporate the degradation phenomena during the lifetime of the device 1, a sample degradation profile for various components (PV, concentrator 25 and electroyzer EC) is generated. The concentrator degradation is modelled using $C_{new} = C(1-0.0065 \text{ years})$. PV degradation is modelled via an effective concentration received by the PV to be degrading with the lifetime as $C_{PV\_new} = C_{new}(1-0.01 \text{ years})$ which incorporates both open-circuit voltage ($V_{OC}$) and short-circuit current ($I_{SC}$) degradation. The three parameters from our model, i.e. $H^+$ diffusion coefficient in the separating membrane 21, gas diffusion layer's conductivity, the catalyst's exchange current densities are chosen to mimic the real degradation behaviors. The $H^+$ diffusion coefficient in the electrolyte membrane 21 is used to model the decrease in the EC's saturation current with time. The gas diffusion layer's conductivity is used to model the increase in ohmic losses and specifically to capture the high EC's efficiency losses at high current. Additionally, the exchange current density of anode/cathode (e.g. $IrRuO_2/Pt$) is used to model the increase in the activation over-potential with time. Combining these three parameters a sample degradation profile which mimics the realistic phenomena occurring in the electrolyser is generated and is used for the degradation analysis. These three parameters' decrease with time is given by $J_{new} = J(1-0.1 \text{ years}/3)$ (where J is the exchange current density of anode/cathode), $D_{new} = D(1-0.1 \text{ years}/3)$ (where D is the $H^+$ diffusion coefficient in the membrane) and $\sigma_{new} = \sigma(1-(-0.002 \text{ years}^2 + 0.0817 \text{ years} - 0.0083 \text{ years}))$ (where σ is the GDL conductivity).

Figure 2:
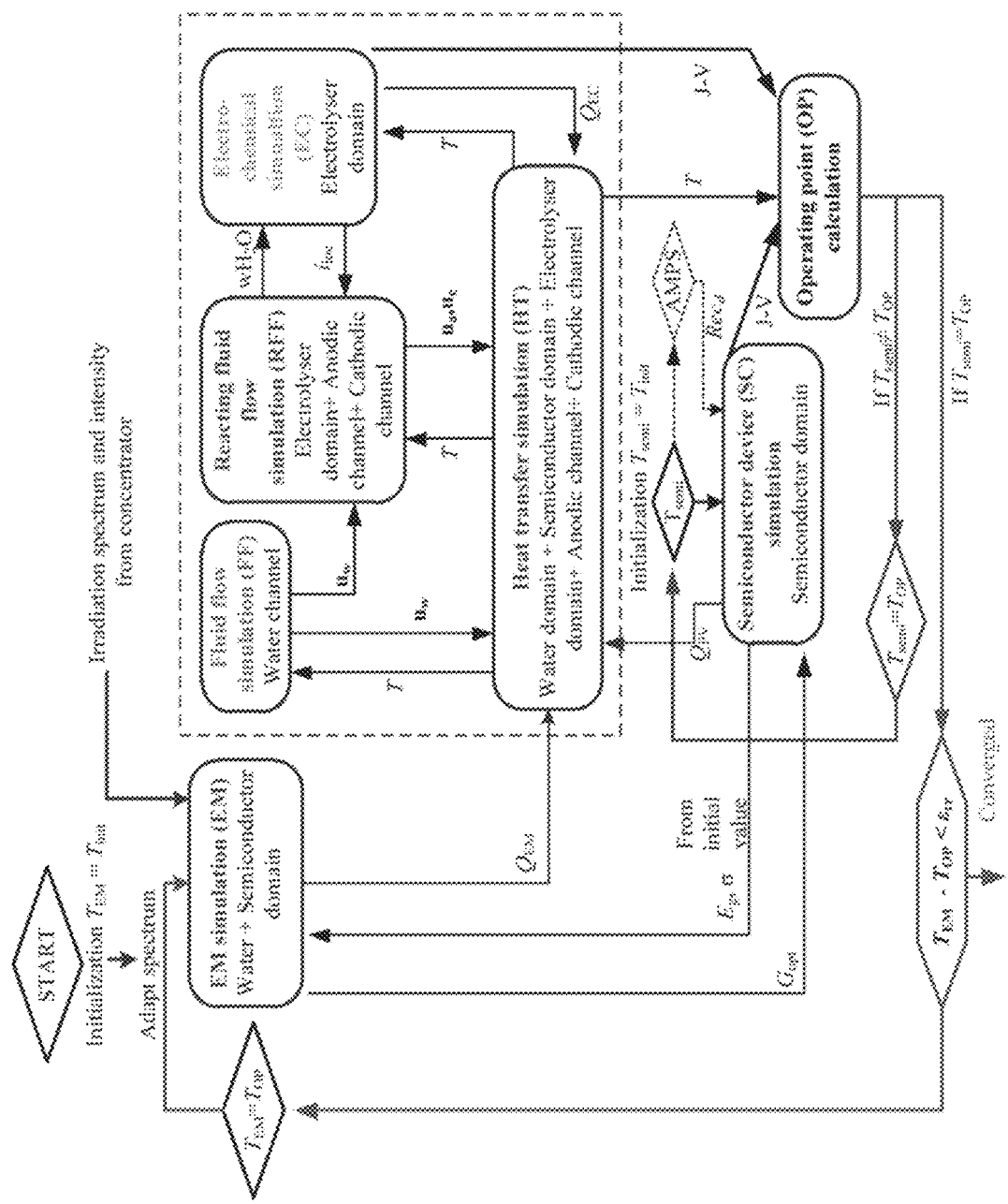

Non-isothermal treatment was used in the entire modeling framework. Detailed simulation flow, and coupling between different physical nodes are shown in FIG. 2. The simulation flow is completely automated; efficient computational power saving techniques were rigorously employed, making this model detailed yet computationally economic in nature.

Thermal Management an Extremely Important Design Consideration

Two reference cases were defined, utilizing i) a triple junction thin film aSi-ucSi-ucSi cell having a p-n-cathodic-anodic configuration, and ii) a dual junction III-V based $Ga_{0.51}In_{0.19}P$—GaAs cell incorporating a n-p-anodic-cathodic configuration. The optical thicknesses for these cells are examples which were not optimized (for modelling). Henceforth, reference case I refers to the thin film Si based, and case II refers to the III-V based IPEC device. The input to the PV is assumed to come from a perfect concentrator with 100% optical efficiency and an AM1.5G spectrum. The spectral irradiation was approximated using 150 wavelength bands with a total input intensity ($I_{in}$) of 1000 W/m². This was done to give a general understanding of effects of the AM1.5G spectrum rather than being limited to a spectrum coming from a particular concentrator. The C factor is defined as the ratio of solar power input on concentrator surface to the solar power received on PV's surface, it represents the effective irradiation concentration. C can be calculated by measuring the input power at concerned surfaces or also by multiplying concentrator system's optical efficiency to the ratio of the areas that is $A_C/A_{PV}$. The F factor, defined as $A_{EC}/A_{PV}$, is chosen to be 1 in the simulations' analysis. This choice is not optimal from a performance and cost point of view but represents a closely integrated device. The solar to hydrogen efficiency (STH) is calculated using $$\eta_{STH} = \frac{J_{op} \cdot E_{eq}^0}{C \cdot I_{in}}, \tag{8}$$

assuming Faradaic efficiencies of 1 and a negligible product crossover with $E_{eq}^0$, equal to 1.23 V (equilibrium potential for pH=0, T=298 K, and atmospheric pressure).

The temperature independent baseline parameters used in the analysis are shown in FIG. 7. The operational temperature was maintained below 80° C., implying operation with liquid water and no dry out of the polymeric electrolyte membrane. The results and discussions for various parametric analysis and the effects of thermal management are presented. The results are for reference case I unless otherwise specified.

Water mass flow rate plays a major role in the thermal management. Water with an initial temperature of 293 K is fed through the inlet with varying mass flow rates per length (range: 6 g/s/m to 400 g/s/m), corresponding to varying normal velocities of the water (range: 0.03 m/s to 2 m/s). The two objective functions, $H_2$ production rate and STH efficiency, were studied for each change in water mass flow rate for a range of irradiation concentrations (1-1000). The $H_2$ production rate is proportional to the operating current density.

Figure 3A:
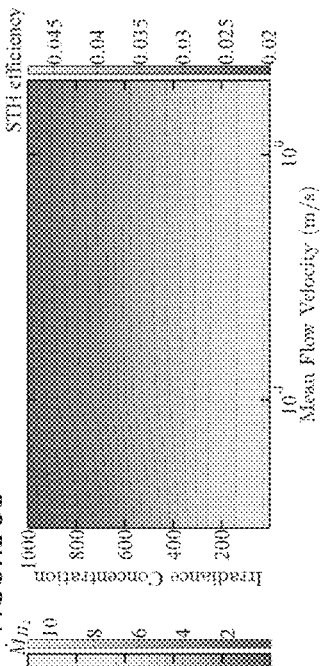
Figure 3B:
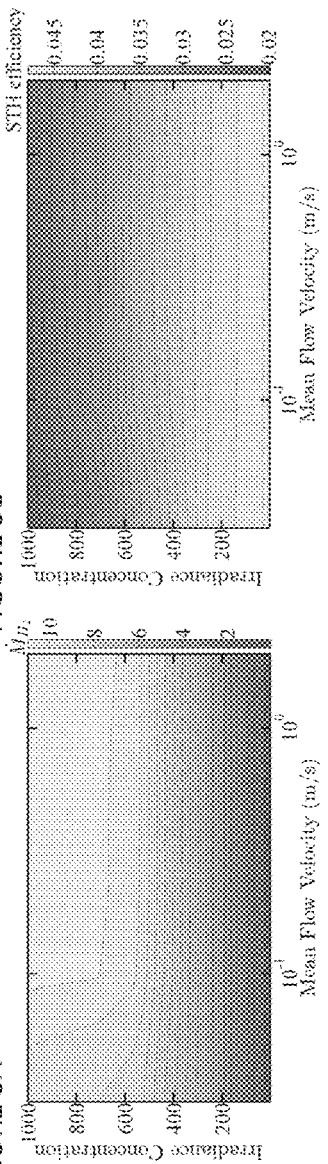

For any concentration in the low concentration range (i.e. C<300), the increase in mass flow rate leads to a decrease in $H_2$ production, $\dot{M}_{H_2}$, as is evident from FIG. 3A, though this decrease is minimal. At larger C, this trend reverses and $H_2$ production increases. This increase becomes more significant in the larger C range (i.e. 750-1000). FIG. 3B shows a similar trend for STH efficiency. The reversal in trend for both $H_2$ production and STH efficiency is due to the two specific operating regions observed in the characteristic J-V curves. The occurrence of these two regions in detail is now explained.

The slope of the linear region of the EC curves decreases with decreasing mass flow rate, see FIGS. 4A to 4D, due to increased charge transport losses, mostly resulting from the increased temperature of the stream. The saturation current of the EC decreases with decreasing mass flow rate due to mass transport limitations occurring in the porous electrodes. Due to this behavior, the EC curves for varying mass flow rates at a given concentration intersect in a small voltage range, giving rise to two regions of characteristic operation for the device (indicated as regions I and II). In region I, at a particular C, the EC curves shift to the right side on the voltage scale with increasing mass flow rate, while in the region II they shift to the left side. The identification of the two characteristic operating regions explains the performance effects observed for varying concentrations: increasing the concentration from small to large values shifts the operational point from region I to region II, resulting in the previously discussed trend for $H_2$ production rates and STH efficiencies. The stronger changes observed for concentrations above 450 result from operation in the falling region of the J-V curve of the PV, leading to a drastic efficiency decrease with mass flow rate decrease.

Figure 3C:
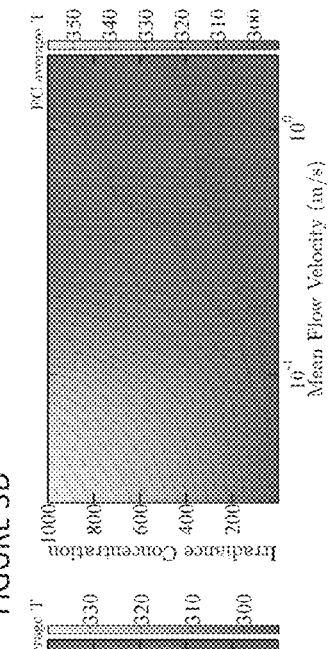
Figure 3D:
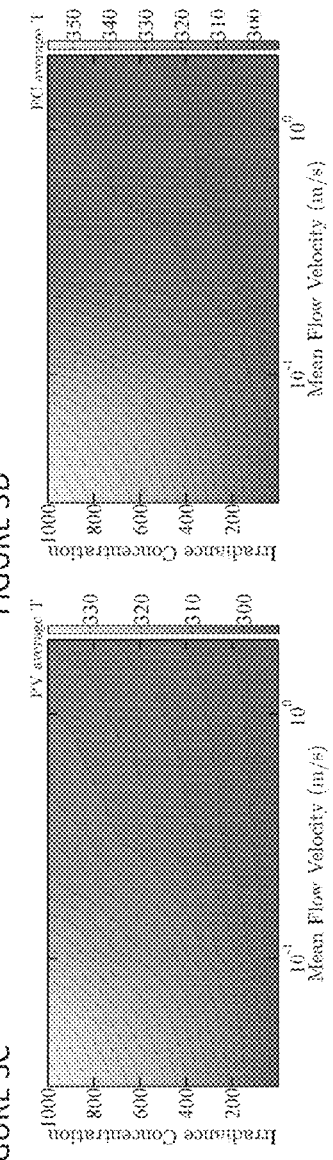

Average EC and PV temperatures, FIGS. 3C-3D, decrease with increasing water mass flow rates. At a mean flow velocity of 0.03 m/s, there is a 40-fold increase in the $Q_{EC}$ (EC heat source) when going from C=53 to 1000. At a mean flow velocity of 2 m/s, for the same concentration range, the increase in the $Q_{EC}$ is 48-fold. Similar behavior is observed for the PV heat source, $Q_{PV}$. However, despite of significant increases in heat sources, the temperature increase in the EC and PV at large mass flow rates is only a few Kelvins, as opposed to increases in temperature of tens of Kelvins for low mass flow rates.

These results imply that higher water mass flow rates have a better cooling capability than low mass flow rates. Additionally, high mass flow rates allow the operation at high C with increased saturation current of EC, and hence increased operating currents.

Figure 3E:
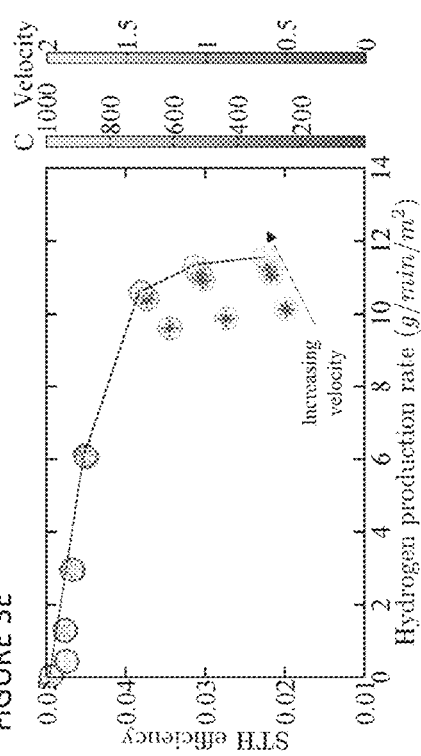
Figure 4A:
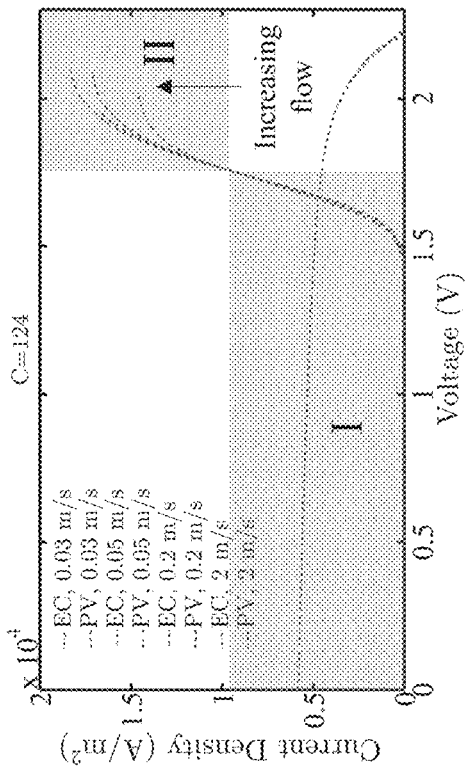
Figure 4B:
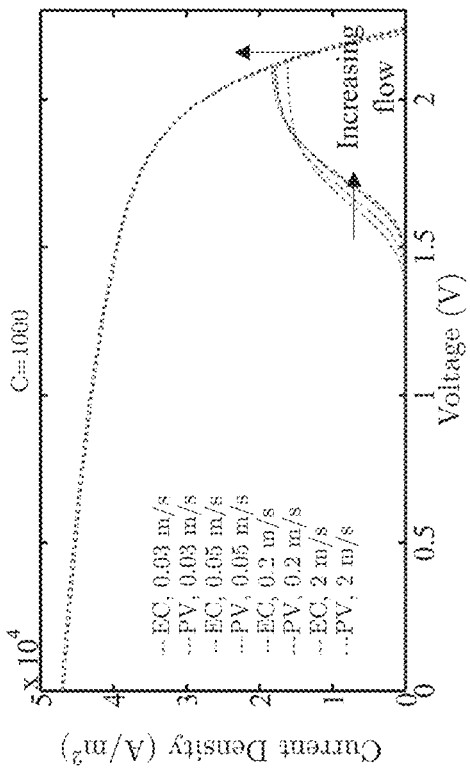
Figure 4C:
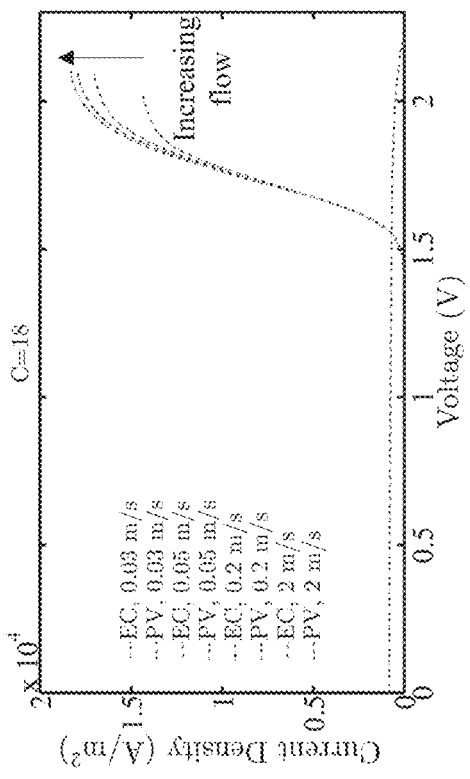
Figure 4D:
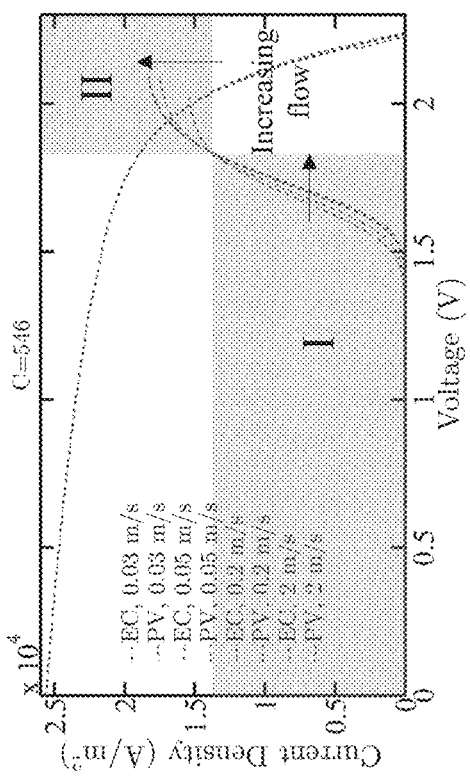

The optimum region of device operation (depends on the PV's short circuit current and EC's saturation current) for highest $H_2$ production occurs in the large concentration range (700-1000) for reference case I and at large water mean flow velocities (0.1-2 m/s). In contrast, the preferred region of operation maximizing the STH efficiency lies in the low concentration range and is independent of the mean flow velocities in the inspected range (0.03-2 m/s). This competitiveness in the objectives of $H_2$ production and STH efficiency is plotted in FIG. 3E. With the aim of having increased $H_2$ production along with increased STH efficiency, we observe that the various device configurations, FIG. 3E, form a Pareto front implying the absence of a global optimum but the existence of a range of semi-optimal efficiencies. The frontier has no specific trend with respect to C, but consists mainly of parameter combinations with the highest mean flow velocity. The optimum mean flow velocity is around 0.2 m/s, as evident from FIGS. 3A to 3E, above which the variations in STH efficiency, $H_2$ production, and temperature become negligibly small.

For reference case II, i.e. with a dual junction $Ga_{0.51}In_{0.49}P$—GaAs, a similar behavior as for the reference case I is observed, including the formation of the two distinct operational regions (I and II). The optimal concentration is at C=180 and a mean flow velocity of 0.2 m/s. For larger concentrations the $J_{sc}$ of the PV is always larger than the saturation current of the EC (i.e. for the case when PV area is equal to EC area as shown in FIGS. 1A to 1B). The $J_{op}$, and therefore $\dot{M}_{H_2}$, minimally increase with increasing mean flow velocity until C=150, and significantly increase for C=150 to 1000. The STH efficiency increases with increasing mass flow rate. For reference case II, the $J_{op}$ and STH efficiency trends are not the same as for the reference case I. There is no reversal in trend for $H_2$ production and STH efficiency as C increases, despite the formation of two distinct operational regions. This follows from the location of the operational points, which always lie in region II. The temperature variations show the same behavior as reference case I. The tradeoff between $H_2$ production and STH efficiency also leads to a Pareto front for reference case II. However, this front is relatively flat and closer to a global optimum. For reference case II, ~100% of the maximum STH efficiency and ~96% of the maximum $H_2$ production can be chosen at the same time whereas for reference case I the best configuration turns out to be the one with 50% of the maximum of both objective functions.

Figures 5A, 5B:
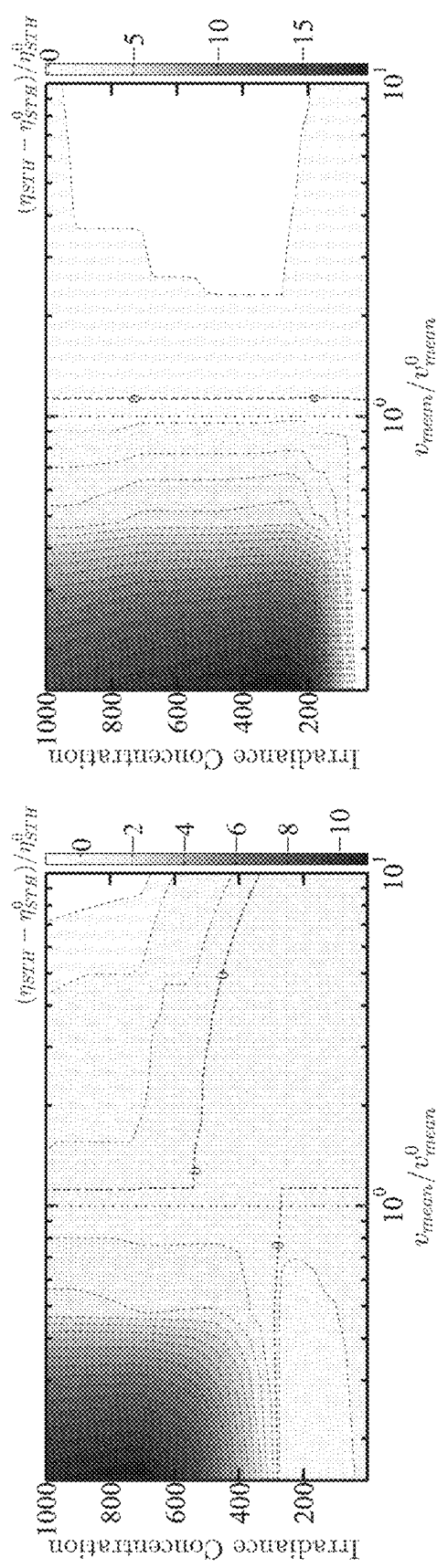
Figure 6A:
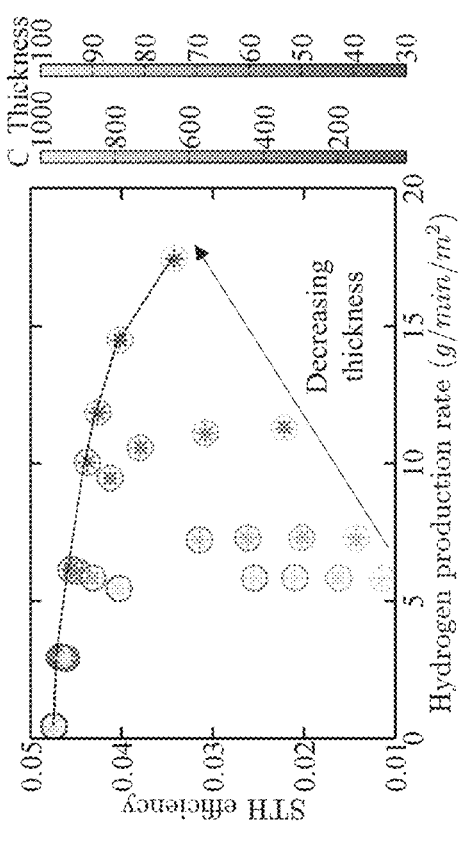
Figure 6C:
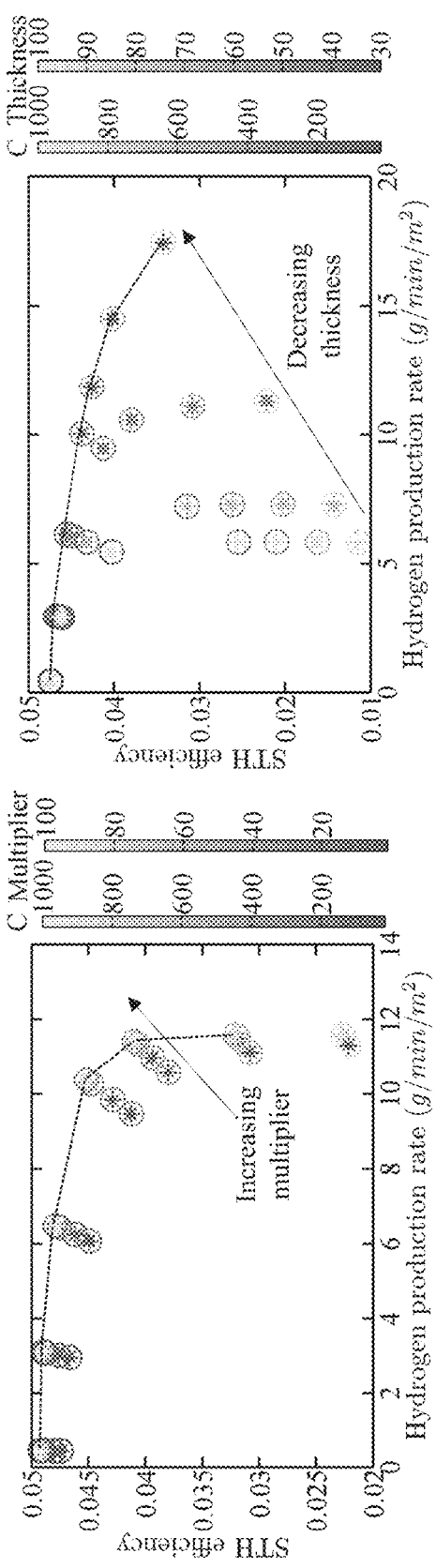
Figure 6B:
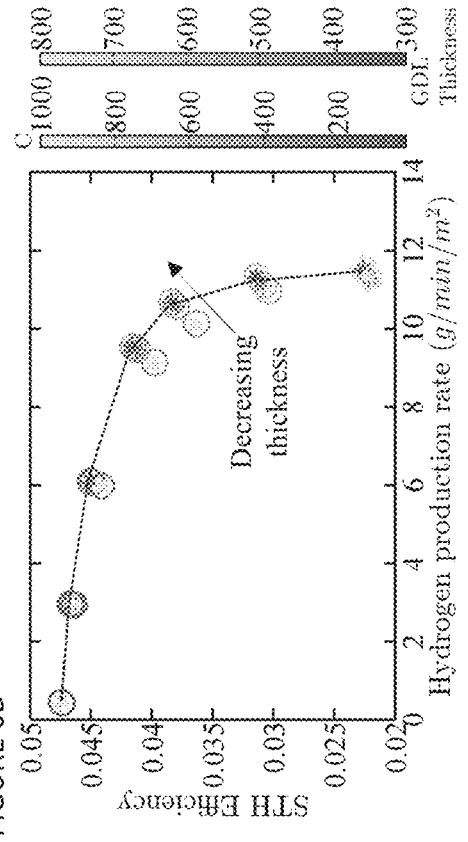
Figure 6D:
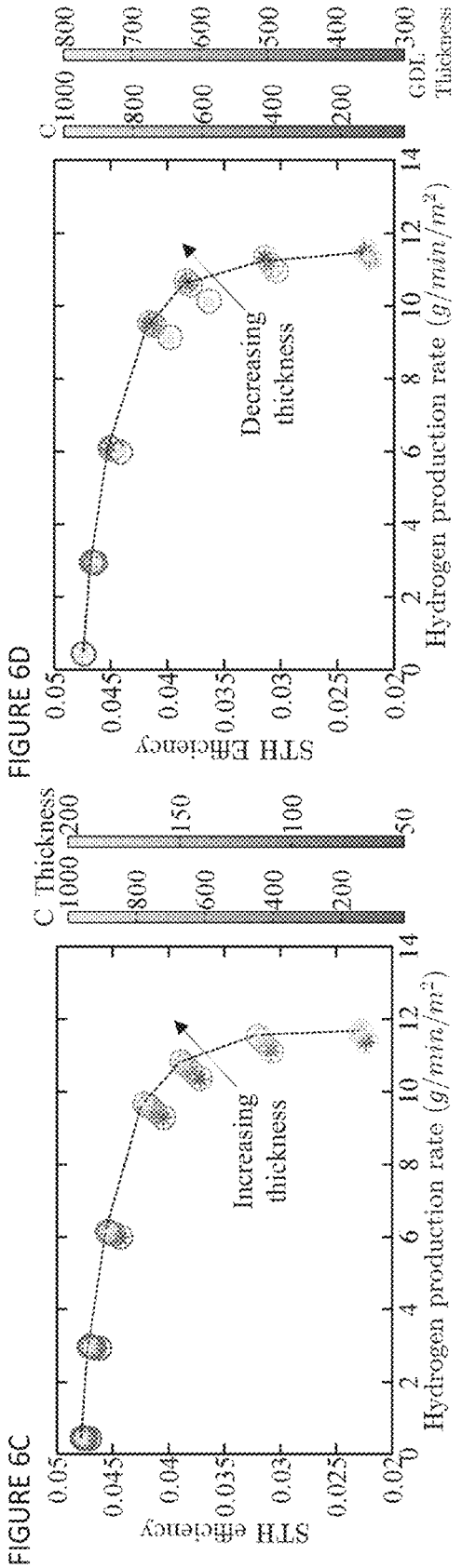
Figure 8A:
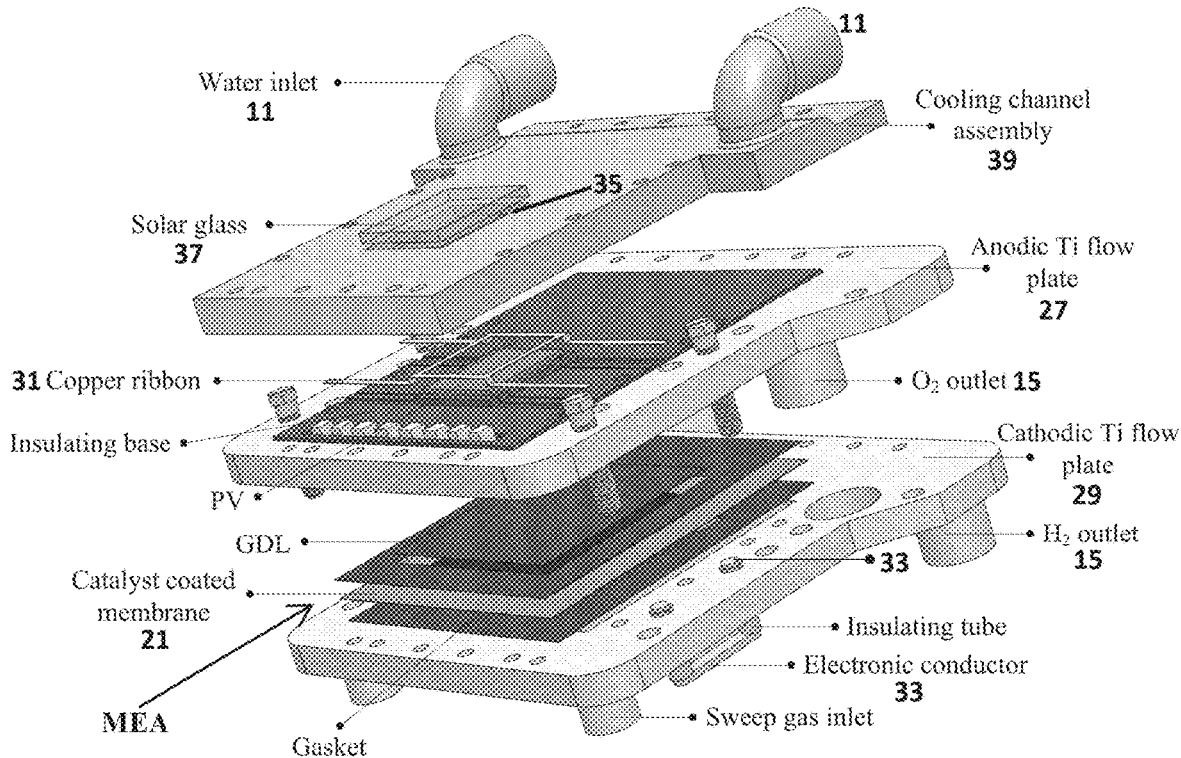
FIGS. 8A to 8E illustrate an exemplary implementation of a CIPEC device design with (FIG. 8A) detailed exploded view, (FIG. 8B) full assembeled view, (FIG. 8C) top and side view of cooling channel assembly, (FIG. 8D) side and bottom view of cathodic flow plate, (FIG. 8E) bottom and side view of anodic flow plate.
Figure 8B:
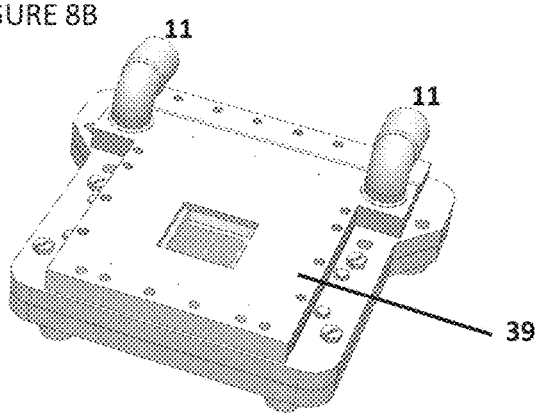
Figure 8C:
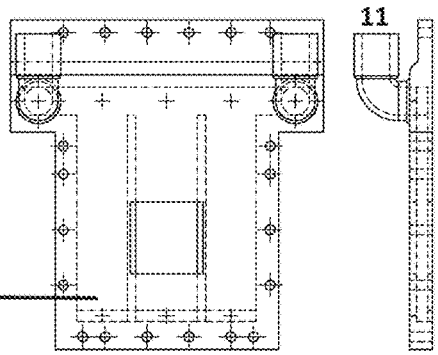
Figure 8D:
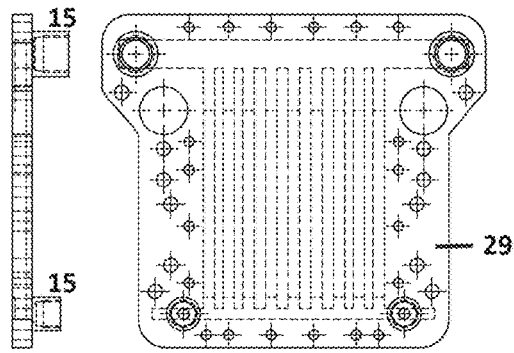
Figure 8E:
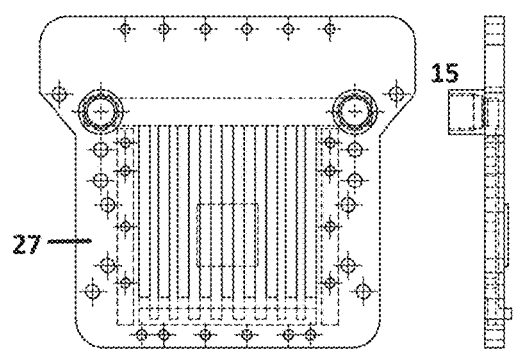

The regions of enhanced performance for the thin film Si based device and III-V based device are quantified in FIGS. 5A and 5B respectively. The contour plot of FIG. 5A agrees with the STH efficiency trend reversal after C=300 shown in FIG. 3B. The x-axis value of 1 corresponds to the reference mean flow velocity, $v^0_{mean}$, of 0.2 m/s. $\eta^0_{STH}$ is the STH efficiency at 0.2 m/s for the corresponding concentration. FIG. 5A shows that maximum efficiency enhancement is observed for C>300 and 0.1 m/s≥$v_{mean}$≥0.03 m/s. For example at C=546, the STH efficiency increases by 9.2% when $v_{mean}$ increases from 0.03 to 0.2 m/s. For the III-V based case, the significant STH efficiency improvement is seen for C>180 and 0.1 m/s≥$v_{mean}$≥0.03 m/s. For example at C=546, an efficiency increase of 17.5% is observed for an increase in $v_{mean}$ from 0.03 to 0.2 m/s. Both plots show that there are large efficiency enhancements for higher concentrations with increases in the mass flow rates.

In summary, the reactant mass flow rate plays an integral role in thermal management in integrated devices. IPEC devices 1 can be operated without significant decrease in performance, even at very high irradiation concentrations, provided the water flow velocity in the cooling channel 5 is preferably at least 0.2 m/s. The changing mass flow rate doesn't affect the performance at low C, but has the potential to significantly improve STH efficiency for larger concentrations. When operating in region II (often given at high C), the mass flow rate allows for control of the operating point of the integrated device 1 and thus can be used as a controlling parameter to counteract component degradation over the device lifetime. This is particularly pronounced if operation is close to the maximum power point of the PV. The inventors predict that the device degradation and the corresponding decrease in performance over the lifetime of the system can be controlled by smart thermal management. For example, for operation of the Si-based device at C=707, a 12% degradation in STH efficiency can be compensated with a seven-fold increase in the water mass flow rate if the operating point remains in region II, i.e. degradation overpotential in the EC is limited to about 250 mV. This shows that smart thermal management—possible due to the integrated nature of the device design of the present disclosure—contributes significantly to a device with stabilized and high performance over an elongated fraction of device lifetime. Additionally, thermal management controls and/or reduces the component temperature, which is expected to further reduce the rate of thermally-induced degradation phenomena.

Hydrogen production and STH efficiency increase for more active catalysts, i.e. increased exchange current density and active specific surface area (ASSA), at a particular C. $H_2$ production is maximized at large C while STH efficiency is maximized at small C (for example C<300). Consequently, a Pareto front exists which consists of cases with large exchange current density and large ASSA. Interestingly, at low and very large concentrations, the ASSA and exchange current density do not influence the performance, therefore the device performance is independent of any choice of catalyst substrate.

The membrane thickness is important for the performance of the integrated device, as its variation leads to significant changes in the operating points. The mass transport limitations are instigated earlier with increased membrane thickness, leading to reduced saturation currents. The large changes in operating current density with varying membrane thickness lead to significant changes in the EC and PV heat sources. However, the water mass flow rate ensures proper device cooling resulting in small temperature variations (a few Kelvin only). These minimal temperature variations, despite significant increases in heat sources, indicate functioning thermal management for the device. The largest $H_2$ production occurs at largest C and thinnest membranes, whereas the maximum STH efficiency is observed at smaller concentrations (C≤200), and is found to be independent of membrane's thickness. The objective functions of $H_2$ production and STH efficiency form a Pareto front which consists mainly of the cases with the thinnest membrane (i.e. 30 µm). The other dimensional properties, GDL and catalyst thicknesses, do not lead to significant changes in the operating point with parameter variations. The heat sources, and hence temperature, are found to be quite insensitive to these parameters. The Pareto front for these two cases consists mainly of the thinnest GDL and thicker catalyst. The Pareto fronts showing sub-optimal efficiencies for the above discussed dimensional and catalyst properties are shown in FIGS. 6A to 6D.

The sum of $Q_{EM}+Q_{PV}+Q_{EC}$ is higher (1.5-2 times) for the III-V based case than the Si one for the choice of design parameters presented in FIG. 7. Despite this, the $T_{PV}$ and $T_{EC}$ were observed to be less than or comparable to reference case I. This implies that the n-p-anodic-cathodic configuration, used in reference case II, provides better cooling. This results from the direct feed of the water from the cooling channel above the n-side of the PV to the anodic channel lying between the p-side of the PV and the EC's anode, making the location central within the major heat sources in the device, resulting in better heat removal. 2D modelling provides locally resolved information which is necessary for complete design guidance and optimization of PEC devices. Thermal hot spots in a device operating at high irradiation concentration can be reduced utilizing calculated, spatially resolved temperature profiles, reducing the thermal and operational stress on photoabsorbers or catalysts, and optimizing the performance with potentially slowing their degradation rate.

The two objective performance functions ($J_{op}$ and STH efficiency) show a saturating trend with increasing dimensional, operational, and material parameters. Mean flow velocity of 0.2 m/s (40/g/s/m), exchange current density of 50 times the standard value, ASSA of $10^5$ m$^{-1}$, catalyst thickness of 200 nm, and GDL thickness of 300 um were found to be the optimum values for enhanced performance of the integrated PEC device for C=707. Similar values are observed for other irradiation concentration factors.

Flow Rate Based Optimum Power Point Tracking

The sun being an intermittent source of energy, irradiance received during the day is never constant. In fact the irradiance received at a particular location depends on the sun's path relative to that location, as well as majorly on local weather conditions such as cloud coverage. Hence, the optimum operating point during the peak irradiance hour may not be the optimum during the non-peak irradiance hours; implying tracking of the optimum power point during the day is needed. This can partially be done with an external DC-DC conversion based maximum power point (MPP) tracking, though deployment of additional external power electronics may not be a good option compared to the water mass flow rate based tracker of the optimum power point of the present disclosure.

To show the significance of the water flow rate controlling for stabilising the daily product output and efficiency from the system, the characteristics curves of the IPEC were simulated with varying daily irradiance levels (ranging from 20%-140%, where levels from 20-130% are realistic and 140% is included to account for minor concentrating effects), shown in FIGS. 11A-11B. Here an example of the IPEC device designed to be working with 0.03 m/s is taken at the start of the device life and for which the operating point lies at the MPP of the PV component at avg. irradiance of 800 W/m$^2$.

The comparison of the operating current as well as the STH efficiency for the two flow rates depicts that the cross-over, FIG. 11C, happens after around 80% irradiance level. The operating current decreases with irradiance however the STH efficiency increases (due to the slope in plateau region of the PV/existence of shunt resistance). The cross-over implies that it is beneficial to operate at lower flow velocity of 0.03 m/s for 0-80% irradiance levels and at 0.2 m/s for the rest of the day.

If a comparison is to be made among the DC-DC based MPP tracking with overall 93% efficiency and the water flow rate based optimum power point tracking of the present disclosure, it is found that the DC-DC based approach loses most of the time. FIG. 11D, highlights that the operating current density obtained with an external MPP tracker is always lower (except for >110% irradiance levels) than the output achieved without it. This effect is more pronounced for the cases with low fill factor PV (as is for aSi-ucSi-ucSi shown in FIG. 11D). If the operating power (supplied PV power/received EC power) is greater than the 93% of the maximum power achievable, the use of an external MPP tracker is not justified. Only for cases where the integrated operating point lies far away from the MPP (difference>7% of MPP for 93% efficient approach), the external MPP tracker should be used; however this happens rarely in realistically and well-designed system. In fact, the benefits expected to be achieved by DC-DC based MPP tracker can be obtained (in increasing folds) with the flow rate control based tracker as shown in FIG. 11D and are evident from the higher output of the 0.2 m/s case (which is higher than the MPP tracker case for 0.03 m/s). The output maximisation can be achieved more efficiently with an internal mass flow controller rather than an external power-electronics (MPP tracker) component; this shows that the water flow rate control can act as an efficient internal optimum power point tracker. Though it should be noted that the increase of operating current with the flow velocity has a saturating trend and normally the benefits of mass control are limited to the flow rates per length of 40 g/s/m (~flow velocity of 2 m/s).

To understand the benefits of the water flow rate based controlling approach for a realistic daily irradiance variation, FIGS. 12A to 12D shows the flow controlling profile to be adopted for different irradiance profiles and the percentage increase as well as stabilising effect on the output from the system.

Figure 12D:
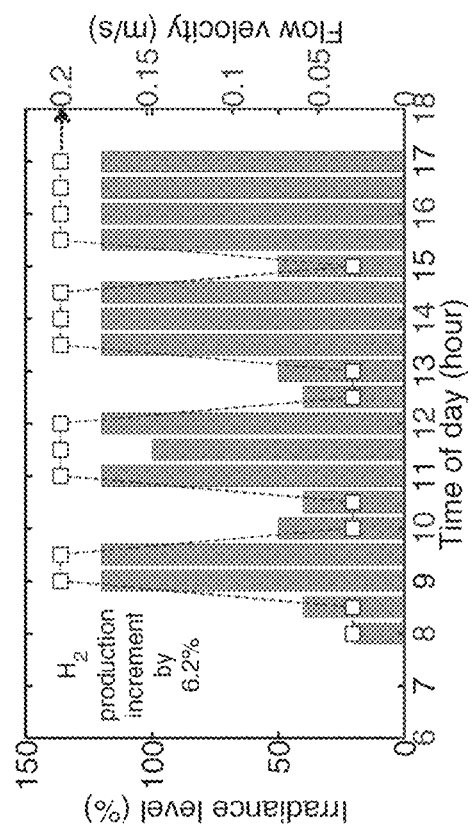

For the exemplary irradiance profile of FIG. 12A the STH efficiency for 0.2 m/s and 0.03 m/s are plotted in (b). It can be seen for the irradiance levels <80% the 0.03 m/s bars are higher than the 0.2 m/s bars; hence by varying the water flow velocity during the day (as per the profile shown in FIG. 12B with the arrow pointing to the right) the efficiency and output is stabilised as well as having a total increment of 4% in daily averaged $H_2$ production (i.e. the average operating current density increases from 10734 to 11167 A/m$^2$). The increment obtained with the flow rate controlling profile depends on the irradiance profile itself. Two more exemplary daily irradiance profiles are presented in FIGS. 12 C-12D and the respective flow velocity to be varied is also shown. This shows that the output product increment could be as high as 6.2% (FIG. 12 C) and it could even be as low as 1.3% as shown in FIG. 12D. In fact the benefit is directly proportional to the number of times the irradiance switches from below 80% to above and for how long it stays there. A fully flat irradiance profile (with no switch over from under 80% to above) would mean that flow rate based controlling would not be of any use, though such irradiance cases are very rare. Additionally, the benefits are even less (though still noticeable) if the device is already operating at 0.2 m/s rather than the current assumed operation with 0.03 m/s. It should also be understood that the controlling approach depends on the exact nature of the characteristic curves of the PV and EC components of the device, implying the deciding level of 80% would be different for different material based devices. Hence, such an analysis is recommended to be performed before the physical installation of the system and once the material choices are fixed.

To understand the effects of water flow rate control on degradation alleviation, the characteristic curves for 0.03 m/s (FIG. 13A) and 0.2 m/s are plotted on top of each other (FIG. 13B). At the start of the operation of the device the operating points for both 0.03 m/s and 0.2 m/s lie in the operational zone II.

Two important things are noticed in FIG. 13B as one goes to later operational years; i) the benefit of switching from one water flow rate to another (in this case going to higher flow velocity) keeps on decreasing with time and degradation (shown with decreasing size of the ellipse), ii) the operational zone (shown with ellipse) gets closer and closer with time to the cross over point of the EC (shown with the circle) and in fact after around 11 years (for reference case I) the operating points shift and start lying in zone I. Both i and ii lead to interesting behaviour on the performance of the device. The solar-to-hydrogen (STH) efficiency's variation with time for the two water flow velocities is shown in FIG. 13C; where the initial advantage of choosing a higher flow velocity soon starts diminishing and after ~11 years it is no longer beneficial to operate at a flow rate of 0.2 m/s, instead the device should be operated at 0.03 m/s. Similar trend is observed for the $H_2$ production depicted by the operating current density trend. In fact the cross-over point depends on the device's material and operational choices e.g. the STH efficiency and current density variation with operational time for the GaInP—GaAs dual junction III-V based PV material at C=180 suns (FIG. 14A) depicts that there is no crossover for the STH curves for the two water flow rates. This is because the operating points for this III-V based PV case always lie in operational zone II.

The water flow rate based control can be deployed to stabilise the output coming from the system. Generally a designer choses to design the system to operate at/close-to (for example, within 1 to 10% of MPP) the MPP-maximum power point (at average irradiance) of the PV component and at the lowest allowable water flow rate. So for FIG. 13D i.e. for III-V dual junction based device, the designer will choose to operate at 0.03 m/s water velocity for C=180 suns where, at an exemplary average day-light hour irradiance of 800 W/m$^2$, the operating point of the IPEC lies at the MPP of the PV. However, as discussed previously, on account of degradation effects the operating current density of the device would keep on decreasing. With the flow rate based control of the present disclosure, one can keep the output production constant for at least 6 operational years by smartly controlling/increasing the water flow velocity. The controlling profile of the water velocity for the decreasing output curve of the device to achieve a stabilised output is presented in FIG. 13D. The cumulated hydrogen production for 6 years (in addition to being very stable) is increased by 5% with this flow controlling profile.

The points at which the two flow rates result in same operating current density (and STH efficiency) termed here as the cross-over point depend on the degradation mechanism and rates. FIG. 14B shows the analysis' results for the case where we consider only the PV degradation (keeping all other components' degradation to zero). It is observed that the cross-over point lies at ~11.4 years which is explained from the corresponding I-V curves where the PV's characteristic curves move over a single (overlapping cluster of) EC curve (as the EC degradation is zero, all EC I-V curves for a flow rate overlap) and cross-over point is decided by the time when the operating points shift from region II to I. A similar analysis has also been performed for the case when only EC component is allowed to degrade. For this case the cross-over point lies at ~6.15 years which is very different from the only PV degrading case. Changing the degradation rates also changes the cross over point, e.g. the cross-over point is at 4.84 years for high rates compared to 6.5 years for the medium degradation rates. This concludes that the cross-over point is highly dependent on the degradation behavior and it is of prime importance to know the degradation rates apriori, which would help in better designing and operating the system.

The yearly degradation analysis highlights that the operational parameter such as input water or reactant flow rate plays a significant role in device's operation and such parameters should preferably not be kept constant during the lifetime of the device. In fact, a smart control of the water flow rate allows efficiency as well fuel/$H_2$ production enhancement during the lifetime of the device. For example, operating at an optimum flow rate of 0.2 m/s is beneficial to achieve 3-21% efficiency enhancements at the start of the operational life of the device, though just after 6 years this enhancement decreases to 0.5-9.5% signifying it may no longer be beneficial to deploy extra energy in going to higher flow rate. After 11 years for the aSi-ucSi-ucSi, in fact, it is beneficial to go to lower flow rates. Water flow based control of the operating point allows to achieve very stable output/production from the system.

Exemplary Implementation of a CIPEC Device

The implementation of an exemplary performance optimized concentrated integrated photo-electrochemical device 1 is shown in FIGS. 8A to 8E. The integrated photo-electrochemical device 1 of the present disclosure may include one or more, or all of these features.

Figure 9:
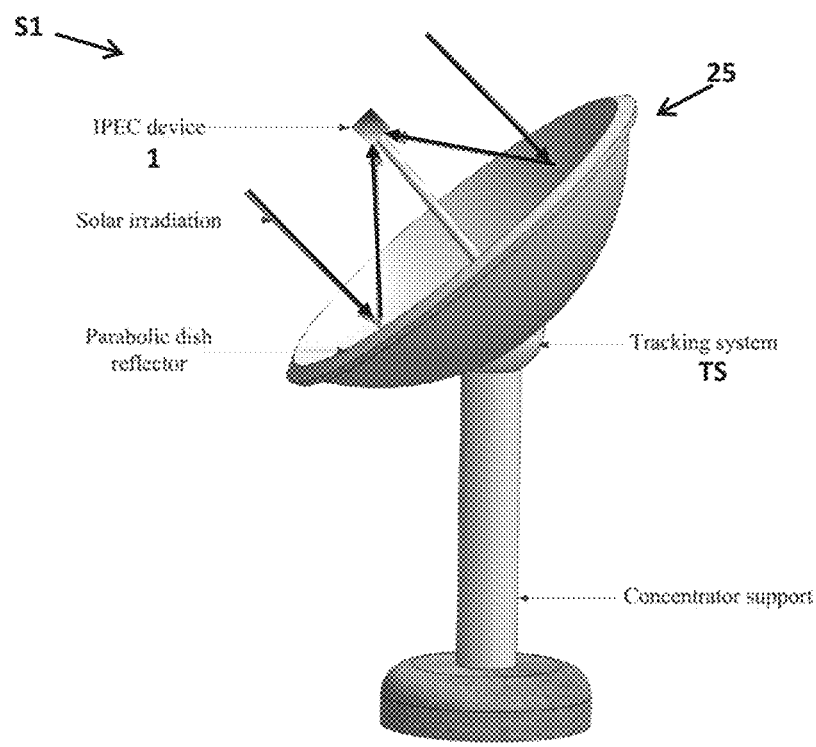
FIG. 9 shows an implementation of the exemplary concentrator system utilising a parabolic dish collector and a tracking system.

The implementation of the concentrator system 25 utilising for example a parabolic dish (for C=100-2000) collector, to collect the incoming solar irradiation and concentrate it on the integrated photo-electrochemical device 1, is shown in FIG. 9. The concentrator system 25 can include and utilize for example a linear fresnel reflector (for example C=50-

200), fresnel lenses (for example C=100-2000), parabolic trough collector (for example C=50-200), and/or self-tracking concentrators (for example C=1-100) depending on the irradiation concentration range to be used.

The CIPEC device 1 can incorporate different photovoltaic device PV and electrochemical device EC areas; and shows heat and flow management based design. The CIPEC device 1 utilizes for example a multi-junction III-V/Si based solar cell which supplies power to the electrolyser (EC) to split for example water.

The photovoltaic device PV and electrochemical device EC devices or components in the exemplary configuration of FIGS. 8A to 8E are arranged in n-p-anodic-cathodic configuration as this is more effective in heat management relative to p-n-cathodic-anodic configuration (shown for example in FIGS. 1A to 1B).

The photovoltaic device PV's 'p' terminal 7 can be for example connected via a highly conductive layer or interface (for example, using silver paste) to an anodic flow plate 27, for example, an anti-corrosive Titanium based anodic flow plate of the electrochemical device EC. The other 'n' terminal of the photovoltaic device PV is contacted to a cathodic (Ti) flow plate 29 via a conductive connection comprising or consisting of (copper) ribbons/plates 31 and conductors or screws 33. The conductors or screws 33 can for example be specially designed silver coated aluminium cylindrical conductors/screws. These cylindrical conductors pass through the electrochemical device EC assembly with an insulating layer (e.g. silicone) around them.

It is preferably important to protect the photovoltaic device PV cells from shorting when immersed for example in de-ionized (DI) water (i.e. the reactant), so either the conductivity of the de-ionized water should be extremely low (<0.001 uS/cm) or the n and p contacts of the PV can be protected from water. As achieving extremely low conductivity for DI water requires multiple stages of de-mineralisation; it is cheaper and better to employ the contact protection method. The photovoltaic device PV module's contacts and all wirebonds can be fully protected with a water resistant epoxy resin. The 10 hour stability and light response plot of the prepared and protected photovoltaic device PV module under water is shown in FIG. 15B.

The electrochemical device EC or electrolyser component can include or is assembeled with for example a membrane electrode assembly MEA which for example can comprise a nafion 115 membrane of 127 μm thickness, IrRuOx (Iridium Ruthenium Oxide) with loading for example of 3 mg/cm$^2$ and Pt (Platinum black) with loading of for example 3 mg/cm$^2$ were coated on nafion and used as anode (for example for oxygen evolution) and cathode (for example for hydrogen evolution) catalysts, respectively. The active area of the MEA can be for example 25 cm$^2$ where the nafion extends out of the active part, having for example an area of 50 cm$^2$.

Teflon gaskets can be used as insulating and sealing gaskets on both anode and cathode sides. Teflon gaskets of, for example, 101.6 μm thickness can be water jet/laser cut in appropriate shape and used as the insulating and sealing gaskets on both anode and cathode sides. A Pt coated titanium mesh can, for example, be used as a gas diffusion layer GDL on the anode side to avoid any oxidation of normally used carbon based GDLs. Carbon cloth or the Ti mesh can be used for the cathode side GDL depending on the compressibility requirements. The GDL-MEA-GDL assembly along with teflon gaskets are sandwiched between the flow plates 27, 29.

The integrated photo-electrochemical device 1 includes an opening 35 and a window 37 covering the opening 35. The concentrated irradiation passes through the window 37 which can for example be a highly transparent solar-glass and a thin layer of the reactant (water) before being incident on the photovoltaic device PV.

The photovoltaic device PV is cooled via a channel assembly 39 comprising one or more reactant channels 5 therein (comprising of three channels 5 for example) which takes the waste heat from the photovoltaic device PV and feeds the anodic compartment 23 of the electrochemical device EC via at least one or more reactant channels 5 in the electrochemical device EC that are in fluid communication with the channels of the photovoltaic device PV (via nine similar channels for example).

Additionally, the far infra-red region of the incoming spectrum (wavelengths>2000 nm) are absorbed, to some extent, in the reactant water allowing full spectrum utilisation as the photovoltaic device PV's absorption spectrum normally lies between 230-2000 nm.

The device 1 can include for example symmetric dual inlets 11/outlets 15. The symmetric dual inlets 11/outlets 15 of the cathodic/anodic/cooling compartment are fed with for example single input 'T' type piping manifolds. Pt—Ti based gas diffusion layers (GDL) can sandwich the Pt/RuO$_2$ (or other catalyst) coated nafion membrane 21 which is compressed between the flow plates 27, 29 using for example electrically masked steel screws. The photovoltaic device PV cooling chamber can be for example made with stainless steel and is electrically isolated from the anodic Ti flow plate 27 using for example a 3d printed/machined polycarbonate/insulating component. All device 1 components except the photovoltaic device PV and the MEA can be and have been 3d printed for accurate cost effective realisation.

The cooling reactant (for example water) is pumped into the top water channel assembly 39 via two inlets 11 through which the water uniformly distributes into the channel or channels 5. The exemplary three channel design allows the photovoltaic device PV area to be accommodated completely in one channel 5, hence enabling the photovoltaic device PV to be flushed with the reactant (water)—fully and continuously.

The number of channels 5 used is governed by the ratio of the width of cooling assembly to that of photoactive part or PV device.

For example, the output of the three channels feeds the nine channels of the anodic flow plate 27, with each channel of cooling assembly 39 feeding three channels of the anodic flow plate 27.

A middle channel 5 removes excess heat from the photovoltaic device PV and supplies the heated reactant to the electrochemical device or component EC. A part of this excess heat is also dissiminated via the two side channels 5 making the (steel based) cooling assembly 39 to also act as a heat sink.

The middle reactant (for example, water) channel also acts as an anti-reflection layer or medium and helps in reducing reflection of the incident irradiation on photovoltaic device PV's top surface.

The number of channels used in the flow plate 27 is governed or can be determined by the catalytic active area of the membrane electrode assembly MEA in order to have good electrical contact as well as enough reactant fed area; a 50% compromise of these two is for example employed in the implemented design of FIGS. 8A to 8E.

The water reactant is oxidised in the anodic chamber 23 and the generated $O_2$ is swept out through the outlet 15 along with excess (non-reacted) reactant (water). The continuous flow of the reactant (water) keeps the membrane wet preventing conductivity losses due to dry out.

Oxygen evolution reaction causes the generation of protons/$H^+$ ions which travel through the (polymeric) membrane 21 to the cathodic side. The electrons from the oxygen evolution reaction OER are transported via the photovoltaic device PV to the cathodic flow plate 29 (and hence cathodic catalyst 19) through the electronic conductor 33. These electrons reduce the $H^+$ ions causing the evolution of the $H_2$.

The produced $H_2$ can be directly supplied to the user depending on the storage and compressibility needs. In the cases where the metal-alloy/hydride based storage for $H_2$ is used, a heat transfer loop can also be created in connection with the storage tanks further improving the system efficiency.

The exemplary implemented device 1 in its experimental testing state is shown in FIG. 15A. The measured I-V characteristics of the prepared electrochemical component EC and PV module (extrapolated from measured performance at C=500 suns) is shown in FIG. 15C. The implemented device is expected to work with a solar-to-fuel efficiency of 17% with electrolyser current density of 1.6 A/cm$^2$ at an irradiance concentration of 800 suns. FIG. 15D shows the 2 hour long stable performance measured for our integrated concentrated photo-electrochemical device where the apparent working concentration is 97 suns and the EC's operating current density is 0.2 A/cm$^2$. The slight increasing trend in the measured product is due to the operating point's variations because of small temperature fluctuations and the increasing water vapor content in the produced gas mixture. Additionally, a stable current of ~19 A (~0.8 A/cm$^2$ EC's current density) is measured for the implemented integrated photo-electrochemical device 1 at an apparent concentration of ~400 suns with operating voltage of ~2V. To the inventor's knowledge, this is the best performing demonstration of the integrated photo-electrochemical production at such high operating current densities.

Controller or Controlling Unit Implementation

As discussed earlier, the reactant mass flow rate plays an integral role in thermal management in the IPEC devices 1.

For example, when operating in region II (often given at high C), the mass flow rate allows for control of the operating point of the integrated device 1 and thus can be used as a controlling parameter to counteract component degradation over the lifetime of the device and to counteract long timescales transients (such as degradation) and short timescale transients (such as irradiation variations).

The controlling unit (or controller) 41 incorporates or includes for example a voltmeter 43 (or voltage sensor) in parallel connection and an ammeter 45 (or current sensor) in series connection (or a hydrogen/product mass flow meter at, for example, the cathode outlet 15) which measures respectively the operating voltage ($V_{op}$) and current ($I_{op}$) of the CIPEC device 1, and more particularly the photovoltaic device PV, in real time.

The voltmeter can be, for example, connected across the copper ribbon 31 (n-terminal) of FIGS. 8A to 8E and the anodic plate 27; the ammeter can be for example connected between the copper ribbon 31 and the electronic conductor 33 making it a series connection.

The Maximum power point (MPP) of the photovoltaic device PV or cell can be, for example, obtained in realtime using Perturb & Observe (P&O) and/or Incremental conductance (Incond) algorithms (Dolara, A., Faranda, R. and Leva, S., Journal of Electromagnetic Analysis and Applications, 1(03), p.152 (2009), which is incorporated by reference herein). The controlling unit 41 includes storage means or a memory in which such algorithms for determining MPP and providing the determined value to the controller 47 are stored. These algorithms are executed by a calculator 48 of the controlling unit 41.

Other techniques for determining the MPP of the solar cell can also be stored and employed e.g the techniques based on the principles of hill climbing, fuzzy logic control, neural network, fractional open circuit voltage or short circuit current, current sweep etc.

The individual current-voltage (I-V) curves can be swept only when the PV and EC components are not electrically connected or when the device is in non-integrated mode and this is achieved with the help of an electronic/mechanical switch at the PV's n-type contact to cathode connector. The switch (not-illustrated) is connected in series for example between the copper ribbon 31 and the electronic conductor 33 or between the electronic conductor 33 and the cathodic plate 29. The triggering of the switch is done by the controller 47 based on whether the integrated mode or the non-integrated mode is desired. The current sweeping give current-voltage characteristics of the PV which for example can be used by the controller 47 that is configured to determine the power-voltage characteristics and accordingly find the voltage $V_{MPP}$, current $I_{MPP}$ and power $P_{MPP}$ at MPP.

MPP, $V_{op}$ and $I_{op}$ which are calculated or measured from the output of the CIPEC device 1 serve as the inputs for the proportional-integral-derivative (PID) controller 47 (or a microprocessor/microcontroller) of the controlling unit 41.

The mapped data of operating points for varied range of input irradiance and reactant (water) mass flow rates (or flow velocities) is calculated using the above disclosed highly detailed 2-d multi-physics model. The same data can be obtained experimentally by measurements under ideal conditions or by fitting equations based on measured data. The mapped data can be stored for example in the PID controller 47 or controlling unit 41, for example, in a memory of the PID controller 47.

A pyranometer or pyrheliometer 49 is for example used for measurement of the realtime solar irradiance whose value is provided as an input to the PID controller 47.

Additionally, the location of the operating point (for example in characteristic region I or II) is mapped to the input irradiance and input water mass flow rate (as set by the PID controller 47) based on the (stored) mapped data provided by the developed 2-d multi-physics model. This data is used in the PID controller's algorithm to determine an output signal to be sent to a reactant mass flow rate controller 51. The output signal is determined based on a desired operating performance or state of the device 1.

The PID controller 47 includes stored algorithms or programs permitting to determine and set a desired operating performance or state of the device 1 based on the the input values and the mapped data of operating points.

Figure 10:
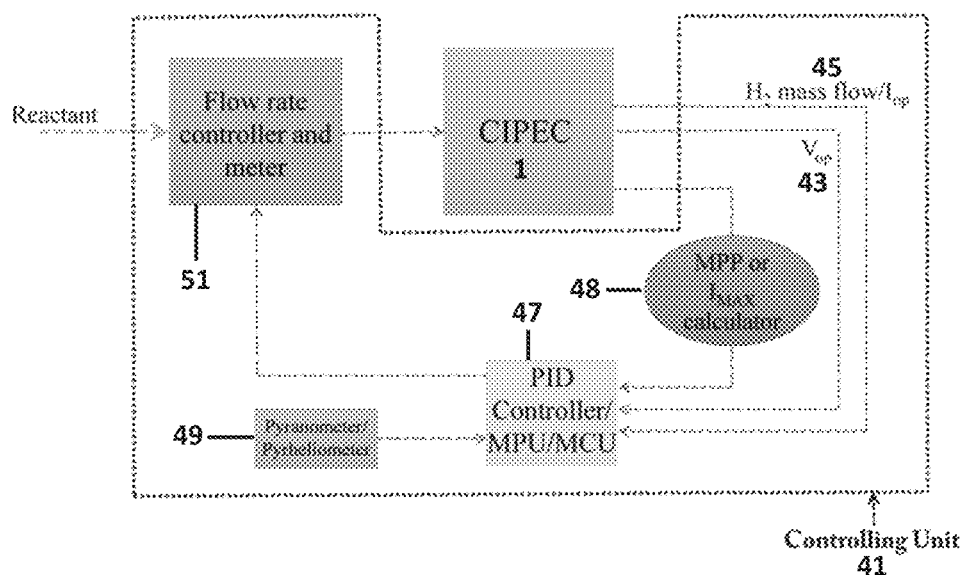
FIG. 10 is a Schematic of the controlling unit for performance optimisation shown along with its various components like maximum power point (MPP) or maximum current ($I_{MAX}$) calculator, PID controller/microprocessor (MPU)/microcontroller (MCU) and flow rate controller and meter.

At the output of the PID controller 47, the water (reactant) mass flow rate controller 51 (for example Bronkhorst Cori-Flow coriolis mass flow meter/controller) is connected which controls the input flow rate/velocity of the water into the IPEC device 1. A detailed schematic of the controlling unit 41 and system including the integrated photo-electrochemical device 1 or the photo-electrochemical system Si is presented in FIG. 10.

In a fully integrated system, the CIPEC device 1 incorporates excess heat transfer, coming from the waste heat of the concentrator system 25, between the concentrator and CIPEC device 1. For this case, the controlling unit additionally incorporates water channels beneath/around the concentrator (reflector) and an additional flow controller and meter to transport preheated water from beneath/around the concentrator to the CIPEC device inlet.

A controlling strategy to optimize the IPEC device 1 performance involves for example measurement of $V_{op}$, $I_{op}$ (or $H_2$ mass flow rate) and determination of voltage at the MPP ($V_{MPP}$) and/or the voltage at the maximum current $I_{MAX}$ for varying reactant flow rates.

The difference between $V_{op}$ and $V_{MPP}$ is calculated and if $V_{op}-V_{MPP}$ is greater than zero and if the operating point lies in the characteristic region I, then the PID controller 47 sends a signal to the mass flow rate controller 51 to reduce the mass flow rate of the reactant (water). The exact reduced value to be implemented by the water mass flow controller 51 is obtained by the PID controller 47 from the earlier calculated mapped data of operating points for varied input irradiance and water mass flow rates.

This calculated mapped data can be stored in storage means (for example, semiconductor memory circuit) of the PID controller or in external storage means. This ensures the left shift (decreased overpotential) of the electrochemical part's I-V curves and the device operates at MPP of the photovoltaic device PV hence with increased performance.

If $V_{op}-V_{MPP}$ is less than zero and if the operating point lies in the characteristic region I, then the PID controller 47 sends a signal to increase the mass flow rate of the reactant (water). The exact increased value to be implemented by the water mass flow controller 51 is obtained again from the mapped data. This causes the the electrochemical cell's I-V curve to be right shifted (increased overpotentials) and the device 1 operates at MPP of the photovoltaic device PV hence optimizing the performance.

On the other hand if the $V_{op}-V_{MPP}$ is greater than zero and if the operating point lies in the characteristic region II, then the PID controller 47 sends a signal to increase the mass flow rate of the water which causes an increase of the EC's saturation current and hence shifts the operating point to the MPP.

On similar lines, if the $V_{op}-V_{MPP}$ is less than zero and if the operating point lies in the characteristic region II, then the PID controller 47 sends a signal to reduce the mass flow rate of the water which causes a decrease of the EC's saturation current and hence shifts the operating point to the MPP. Similar to mass flow rate, irradiation magnitude and concentration can be controlled for steady operation. An MPP based operating strategy is to be followed for the cases where MPP is the optimum operating point.

For the solar to hydrogen production as the $H_2$ production and the STH efficiency are solely governed by the operating current only, a maximum current point ($I_{MAX}$) tracking based strategy is for example adopted. $I_{MAX}$ is the maximum achievable operating current for the varying reactant flow rates derived (by for example PID controller 47) from the stored mapped data in the controller 47 and $V_{MAX}$ is the corresponding operating voltage. For this method, for the cases when voltage at $I_{MAX}$ i.e. $V_{MAX}$ is greater than $V_{op}$ then no action needs to be taken by the PID controller 47, irrespective of whether the operating point lies in region I or II. In all other cases, a method similar to the MPP based operating strategy is followed.

The controller 47 allows the device 1 to operate always at optimized performance, thus alleviating the effects of device degradation over the lifetime and transients occurring due to irradiance fluctuations.

The present disclosure thus concerns an integrated device design working with concentrated irradiation and allows smart thermal management strategies to be developed resulting in Solar to Hydrogen (STH) conversion efficiency enhancements (12-17%). Similar increase in efficiencies is expected for the device used with a different combination of PV and EC driving alternative electrochemical reactions.

The device design allows high efficiency operation even at very high concentrations (e.g. 1000 kW/m$^2$) with proper cooling. This allows for a significant cost reduction of CIPEC devices.

Optimized CIPEC design with variable electrode and photoabsorber area ($A_{EC}/A_{PV}$) resulted in maximized hydrogen production rate with maximized STH efficiency while reducing the cost.

The reactant (water) channel design provides functionality for a) cooling for the photoabsorber, b) feeding of reactant to the electrode, and c) anti-reflection coating, benefiting device performance.

The design allows to use the complete solar spectrum (Ultra-violet+Visible+Infra-red) thus permitting to exploit a large quantity of the received solar energy.

The device incorporates highly conductive and mm-cm scale electronic conductor design for connecting photovoltaics with electrochemical components alleviating the restrictions imposed by ionic conductors.

The symmetric dual inlet/outlet design allows for operation under a very wide range of water/sweeping gas flow rates helping in optimum operating point tracking with mass flow rate control.

The heat and flow management in the device allows the formation of two characteristic regions of operation which control/guide the device performance.

Formation of two distinct characteristic regions of operation allows a controller to be designed which implements performance optimization strategies in realtime thus alleviating the effects of device degradation over the lifetime and transients occurring due to irradiance fluctuations.

A fully integrated system, involves heat transfer between concentrator system and CIPEC device thus further optimizing the system efficiency.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

It should be understood that although the invention has been described in relation to the photo-electrochemical production of hydrogen, the present invention is not limited to only the photo-electrochemical production of hydrogen, but more generally to photo-electrochemical reactions or production of chemical commodities.

The invention claimed is:
1. Photo-electrochemical device for production of a gas, liquid or solid using concentrated electromagnetic irradiation, said device comprising:
   a photovoltaic device comprising single or multiple junctions and configured to generate charge carriers from the concentrated electromagnetic irradiation; and an electrochemical device configured to carry out electrolysis of a reactant;

the photovoltaic device contacts the electrochemical device at a solid interface to form an integrated photo-electrochemical device;

wherein the photo-electrochemical device further includes at least one reactant channel or a plurality of reactant channels fluidically extending between the photovoltaic device and the electrochemical device to transfer heat energy and the reactant from the photovoltaic device to the electrochemical device, and wherein the photo-electrochemical device further includes a mechanical or electronic switch configured to prevent charge carrier flow from the photovoltaic device to the electrochemical device, the charge carrier flow being for electrolysis of the reactant or an electrochemical reaction in the electrochemical device.

2. Photo-electrochemical device according to claim 1, wherein at least one reactant channel or plurality of reactant channels are located on top or beneath or around the photovoltaic device and act as an anti-reflection coating, when located on top, for the incident concentrated electromagnetic irradiation.

3. Photo-electrochemical device according to claim 2, further including one reactant inlet or at least two reactant inlets and a plurality of reactant channels in fluid connection with the one reactant inlet or the at least two reactant inlets to permit reactant flow in the photo-electrochemical device, and further including one reactant outlet or at least two reactant outlets to permit gas, liquid or solid outflow from the photo-electrochemical device.

4. Photo-electrochemical device according to claim 1, wherein the photovoltaic device and the electrochemical device both define a solid planar structure, and an outer solid plane of the photovoltaic device is connected to an outer solid plane of the electrochemical device, and wherein a ratio of (i) an electrochemically active planar area defined by the electrochemical device to (ii) a photoactive planar area defined by the photovoltaic device (Aec/Apv) has a value in the range 0.01 to 13 to optimize device operation for a working electromagnetic irradiation concentration C having a value in the range of C=1 to 1200, the working electromagnetic irradiation concentration being determined by multiplying an optical efficiency of an electromagnetic irradiation concentrator system by a ratio $A_c/A_{PV}$ of a surface collection area of the electromagnetic irradiation concentrator system to the photoactive planar area defined by the photovoltaic device.

5. Photo-electrochemical device according to claim 1, including a cooling channel assembly plate, an anodic flow plate and a cathodic flow plate, and wherein the photovoltaic device includes X number of channels and the electrochemical device includes NX number of channels, where N is a positive real number and X is a non-zero whole number.

6. Photo-electrochemical device according to claim 1, wherein the electrochemical device includes a solid electrolyte or membrane or a membrane electrode assembly, comprising of a membrane coated with catalysts anode and cathode, sandwiched between gas diffusion layers and flow plates anodic flow plate and cathodic flow plate.

7. Photo-electrochemical device according to claim 1, wherein the switch is configured to prevent charge carrier flow from the photovoltaic device to a cathode catalyst.

8. Photo-electrochemical device according to claim 1, wherein the device comprises an n-p-anodic-cathodic configuration or a p-n-cathodic-anodic configuration and at least one channel is fluidically in contact with a n-side or p-side, respectively, of the photovoltaic device and fluidically extends to an anodic chamber located between a p-side or an n-side, respectively, of the photovoltaic device and an anode of the electrochemical device.

9. Photo-electrochemical system including a photo-electrochemical device according to claim 1, and an electromagnetic irradiation concentrator system configured to focus or concentrate electromagnetic irradiation on the photo-electrochemical device.

10. Photo-electrochemical system according to claim 9, wherein the electromagnetic irradiation concentrator system includes at least one parabolic dish collector, at least one fresnel reflector, at least one fresnel lens, at least one parabolic trough collector, or a solar tower collector or any combination of these.

11. Photo-electrochemical system according to claim 9, where the electromagnetic irradiation concentrator system further includes a flux homogenizer made up of or comprising of a combination of optical lenses or compound optical mirrors to homogenize the flux incident on the device.

12. Photo-electrochemical system according to claim 9, further including a self-tracking system configured to determine changes in the concentrated incident irradiation intensity on the photo-electrochemical device and to displace at least one element of the concentrator system to optimise or increase the concentrated incident irradiation intensity on the photo-electrochemical device.

13. System including a photo-electrochemical device according to claim 1, and a controlling unit configured to determine, modify and set an optimized mass flow velocity or rate for the reactant into the at least one reactant channel of the photo-electrochemical device based on values of operating parameters of the photo-electrochemical device.

14. System according to claim 13, wherein the controlling unit is further configured to: (i) determine whether a mass flow velocity or rate value of the reactant in the device is to be adjusted based on a value of a incident electromagnetic irradiation, an operating voltage of the photo-electrochemical device, an operating current of the photo-electrochemical device or a product mass flow rate; and (ii) to generate a signal indicating that a mass flow velocity or rate change is to be carried out.

15. System according to claim 14, wherein the controlling unit is configured to determine whether a mass flow velocity or rate value of the reactant in the device is to be adjusted based in addition on a determined maximum power point operation value of the photo-electrochemical device; wherein a maximum power point is a point on a current-voltage characteristic curve of the photovoltaic device which has a highest value of a product of its corresponding current and voltage.

16. System according to claim 15, wherein the controlling unit is further configured to determine whether a mass flow velocity or rate value of the reactant in the device is to be adjusted based in addition on a mapped data of device operating points for a range of input irradiance and reactant mass flow rates.

17. System according to claim 14, wherein the controlling unit is configured to determine whether a mass flow velocity or rate value of the reactant in the device is to be adjusted based in addition on a current value of the mass flow velocity or rate value.

18. System according to claim 13, wherein the controlling unit is further configured to: (i) determine whether a mass flow velocity or rate value of the reactant in the device is to be adjusted based on an operating voltage and a determined operating voltage value at a maximum current point of the photo-electrochemical device; and (ii) to generate a signal indicating that a mass flow velocity or rate change is to be carried out, where a maximum current point is a point at which an operating current that is a current flowing through the electrochemical device is highest for varying mass flow rates of the reactant.

19. System according to claim 13, wherein the controlling unit includes a voltmeter, an ammeter or product mass flow meter, a pyranometer or pyrheliometer, a calculator configured to determine a maximum power point value or an operating voltage value at a maximum current point, a proportional-integral-derivative controller and a flow rate controller and meter or any combination of these.

20. Method for generating a gas, a liquid or a solid using concentrated electromagnetic irradiation, the method including the steps of:

providing a photo-electrochemical device according to claim 1; and providing an integrated photo-electrochemical device controlling unit to optimise operation of the photo-electrochemical device, the integrated photo-electrochemical device controlling unit being configured to determine, modify and set an optimized mass flow velocity or rate for the reactant into the at least one reactant channel of the photo-electrochemical device based on values of operating parameters of the photo-electrochemical device.

21. Photo-electrochemical device according to claim 1, further including one reactant inlet or at least two reactant inlets, wherein the plurality of reactant channels are in fluid connection with the one reactant inlet or the at least two reactant inlets, the plurality of reactant channels extending inside the photo-electrochemical device to permit reactant flow inside the photo-electrochemical device from the photovoltaic device to the electrochemical device, and further including one reactant outlet or at least two reactant outlets to permit gas, liquid or solid outflow from the photo-electrochemical device.

\* \* \* \* \*